US012812881B2

(12) United States Patent
Liu et al.

(10) Patent No.: US 12,812,881 B2
(45) Date of Patent: Nov. 24, 2026

(54) INTEGRATED DEVICE COMPRISING PLATE INTERCONNECTS AND A MAGNETIC MATERIAL

(71) Applicant: QUALCOMM Incorporated, San Diego, CA (US)

(72) Inventors: Kai Liu, Phoenix, AZ (US); Jui-Yi Chiu, Taichung City (TW); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 916 days.

(21) Appl. No.: 18/161,021

(22) Filed: Jan. 27, 2023

(65) Prior Publication Data

US 2024/0258363 A1 Aug. 1, 2024

(51) Int. Cl.

| | |
|---|---|
| ***H10D 1/20*** | (2025.01) |
| ***H01F 27/24*** | (2006.01) |
| ***H01F 27/28*** | (2006.01) |
| ***H01F 41/04*** | (2006.01) |
| ***H10W 20/40*** | (2026.01) |
| ***H10W 70/60*** | (2026.01) |
| ***H10W 90/00*** | (2026.01) |

(52) U.S. Cl.

CPC ............... *H10D 1/20* (2025.01); *H01F 27/24* (2013.01); *H01F 27/2804* (2013.01); *H01F 41/043* (2013.01); *H10W 20/497* (2026.01); *H10W 70/611* (2026.01); *H10W 90/00* (2026.01); *H10W 90/401* (2026.01); *H01F 27/2809* (2026.08); *H10W 90/724* (2026.01)

(58) Field of Classification Search

CPC .. H01F 17/0006; H01F 27/24; H01F 27/2804; H01F 2027/2809; H10D 1/20; H10W 20/497; H10W 44/501; H10W 70/611; H10W 70/685; H10W 90/00; H10W 90/401; H10W 90/724

See application file for complete search history.

(56) References Cited

U.S. PATENT DOCUMENTS 5,793,272 A * 8/1998 Burghartz ........... H01F 17/0006 336/200
2005/0150106 A1 7/2005 Long et al.
2022/0085143 A1* 3/2022 Choi ................... H01F 17/0013
2022/0375865 A1* 11/2022 Pietambaram ........ H10W 70/65
2022/0377895 A1* 11/2022 Weidinger .......... H01F 17/0006
(Continued)

OTHER PUBLICATIONS

International Search Report and Written Opinion—PCT/US2023/086416—ISA/EPO—May 3, 2024.

*Primary Examiner* — Omar F Mojaddedi
(74) *Attorney, Agent, or Firm* — Loza & Loza, LLP

(57) ABSTRACT

A device comprising a die substrate, a plurality of interconnects located over the die substrate, at least one magnetic layer, and at least one dielectric layer located over the die substrate. The plurality of interconnects comprise a first plurality of plate interconnects, a second plurality of plate interconnects, and a plurality of via interconnects coupled to the first plurality of plate interconnects and the second plurality of plate interconnects. The first plurality of plate interconnects, the plurality of via interconnects, and the second plurality of plate interconnects are configured to operate as an inductor. The at least one magnetic layer surrounds at least part of the plurality of via interconnects.

20 Claims, 14 Drawing Sheets

PROFILE CROSS SECTIONAL VIEW

(56) References Cited

U.S. PATENT DOCUMENTS

| | | | | |
|---|---|---|---|---|
| 2022/0384091 | A1 | 12/2022 | Yoshioka et al. | |
| 2023/0096368 | A1* | 3/2023 | Aleksov | H10D 1/20 257/531 |
| 2023/0207492 | A1* | 6/2023 | Aleksov | H10W 70/635 257/668 |

* cited by examiner

PROFILE CROSS SECTIONAL VIEW

ANGLED VIEW

ANGLED VIEW

PROFILE CROSS SECTIONAL VIEW

PROFILE CROSS SECTIONAL VIEW

INTEGRATED DEVICE COMPRISING PLATE INTERCONNECTS AND A MAGNETIC MATERIAL

FIELD

Various features relate to packages, integrated devices and/or integrated passive devices.

BACKGROUND

Packages can include a substrate, an integrated device and integrated passive device. The substrate may include a plurality of interconnects. The integrated device and/or the integrated passive device may be coupled to interconnects of the substrate.

There is an ongoing need to provide smaller packages with improved performances.

SUMMARY

Various features relate to packages, integrated devices and/or integrated passive devices.

One example provides a device comprising a die substrate, a plurality of interconnects located over the die substrate, at least one magnetic layer, and at least one dielectric layer located over the die substrate. The plurality of interconnects comprise a first plurality of plate interconnects, a second plurality of plate interconnects, and a plurality of via interconnects coupled to the first plurality of plate interconnects and the second plurality of plate interconnects. The first plurality of plate interconnects, the plurality of via interconnects and the second plurality of plate interconnects are configured to operate as an inductor. The at least one magnetic layer surrounds at least part of the plurality of via interconnects.

Another example provides a device comprising a first integrated device, a second integrated device, and a third integrated device. The first integrated device includes a die substrate, a plurality of interconnects located over the die substrate, at least one magnetic layer, and at least one dielectric layer located over the die substrate. The plurality of interconnects comprise a first plurality of plate interconnects, a second plurality of plate interconnects, and a plurality of via interconnects coupled to the first plurality of plate interconnects and the second plurality of plate interconnects. The first plurality of plate interconnects, the plurality of via interconnects and the second plurality of plate interconnects are configured to operate as an inductor. The at least one magnetic layer surrounds at least part of the plurality of via interconnects. The second integrated device is configured as power management integrated device, where the second integrated device is configured to be electrically coupled to the first integrated device through a first electrical path. The third integrated device is configured to be electrically coupled to the first integrated device through a second electrical path.

Another example provides a method that provides a die substrate. The method forms a plurality of interconnects over the die substrate, where forming the plurality of interconnects comprises: forming a first plurality of plate interconnects, forming a plurality of via interconnects that coupled are coupled to the first plurality of plate interconnects, and forming a second plurality of plate interconnects that are coupled to the plurality of via interconnects. The first plurality of plate interconnects, the plurality of via interconnects and the second plurality of plate interconnects are configured to operate as an inductor. The method forms at least one magnetic layer that surrounds at least part of the plurality of via interconnects. The method forms at least one dielectric layer over the die substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a die substrate, a plurality of interconnects located over the die substrate, at least one magnetic layer, and at least one dielectric layer located over the die substrate. The plurality of interconnects comprise a first plurality of plate interconnects, a second plurality of plate interconnects, and a plurality of via interconnects coupled to the first plurality of plate interconnects and the second plurality of plate interconnects. The first plurality of plate interconnects, the plurality of via interconnects and the second plurality of plate interconnects are configured to operate as an inductor. The at least one magnetic layer surrounds at least part of the plurality of via interconnects. The at least one magnetic layer includes an insulating layer, a dielectric layer and/or a non-electrical conducting material. The at least one magnetic layer has a permeability value (e.g., relative permeability value) that is greater than 1. The use of the plate interconnects and the magnetic layer helps improve (e.g., reduce) the resistance of a current that passes through the inductor and improve (e.g., increase) the quality factor and/or the inductance of the inductor.

Figure 1:
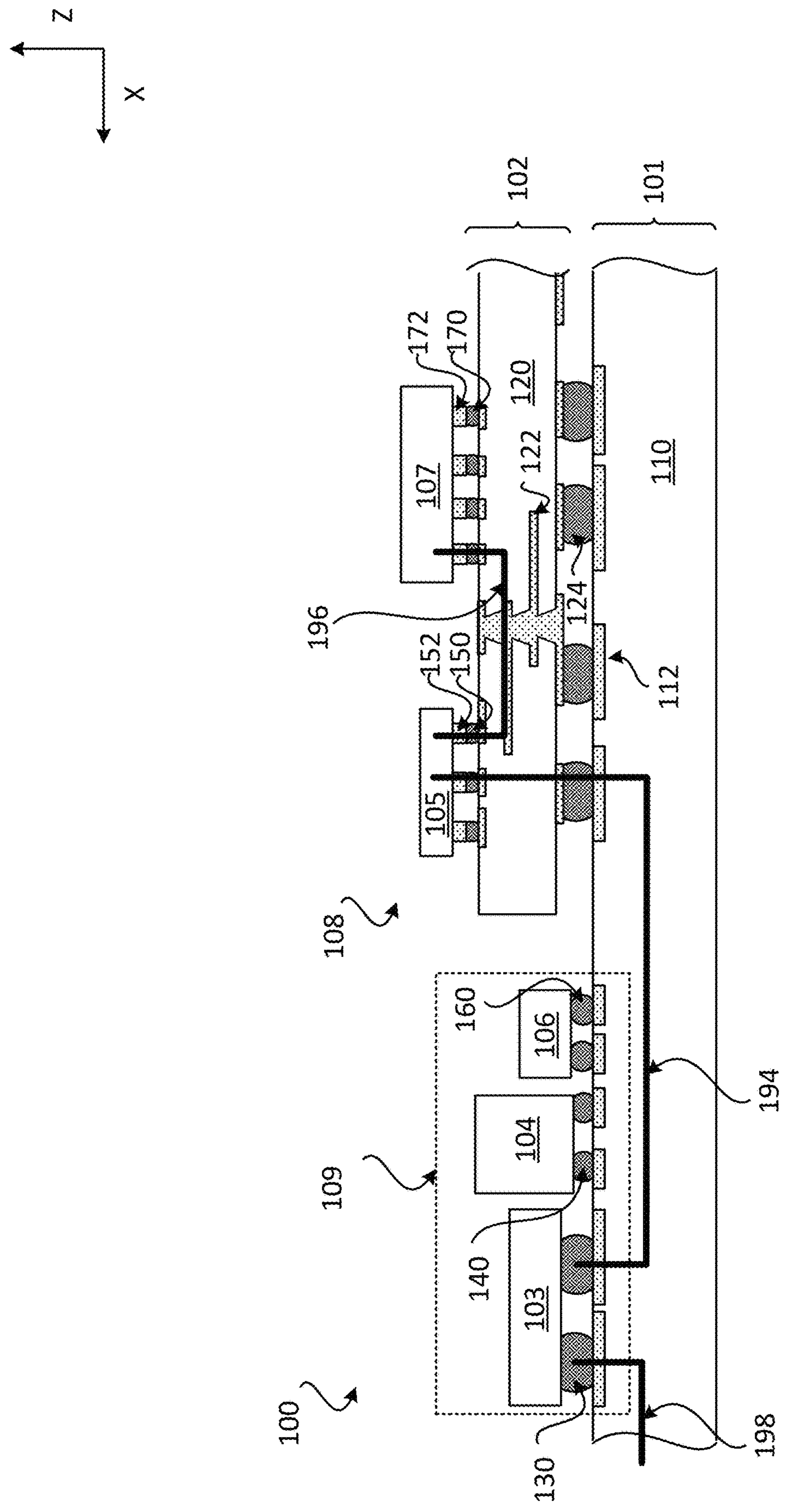
FIG. 1 illustrates an exemplary profile view of a package that includes a substrate, an integrated device and an integrated passive device.

Exemplary Integrated Device Comprising Plate Interconnects and Magnetic Material FIG. 1 illustrates a profile view of an assembly 100 that includes a board 101, a substrate 102, an integrated device 103, a passive device 104, a passive device 106, an integrated device 105 and an integrated device 107. The board 101 includes at least one board dielectric layer 110 and a plurality of board interconnects 112. The board 101 may include a printed circuit board (PCB).

The integrated device 103 is coupled to board interconnects 112 from the board 101 through a plurality of solder interconnects 130. The integrated device 103 may be configured as a power management integrated device. For example, the integrated device 103 may be a power management integrated circuit (PMIC). The passive device 104 is coupled to board interconnects 112 from the board 101 through a plurality of solder interconnects 140. The passive device 104 may be a discrete inductor. The passive device 106 is coupled to board interconnects 112 from the board 101 through a plurality of solder interconnects 160. The passive device 106 may be a discrete capacitor. In some implementations, the integrated device 103, the passive device 104 and/or the passive device 106 may be configured as a voltage regulator 109.

FIG. 1 illustrates a package 108 that is coupled to the board interconnects 112 of the board 101 through a plurality of solder interconnects 124. The package 108 includes the substrate 102, the integrated device 105 and the integrated device 107. The substrate 102 includes at least one dielectric layer 120 (e.g., substrate dielectric layer) and a plurality of interconnects 122 (e.g., substrate interconnects). The integrated device 105 may be coupled to the substrate 102 through a plurality of solder interconnects 150. The integrated device 105 may be coupled to the substrate 102 through a plurality of pillar interconnects 152 and the plurality of solder interconnects 150. The integrated passive device 107 may be coupled to the substrate 102 through a plurality of solder interconnects 170. The integrated passive device 107 may be coupled to the substrate 102 through a plurality of pillar interconnects 172 and the plurality of solder interconnects 170. A substrate may have a different number of metal layers. Different implementations may use different substrates. The substrate may include an embedded trace substrate (ETS). The at least one dielectric layer 120 may include prepreg.

The package (e.g., 108) may be implemented in a radio frequency (RF) package. The RF package may be a radio frequency front end (RFFE) package. A package (e.g., 108) may be configured to provide Wireless Fidelity (WiFi) communication and/or cellular communication (e.g., 2G, 3G, 4G, 5G). The package (e.g., 108) may be configured to support Global System for Mobile (GSM) Communications, Universal Mobile Telecommunications System (UMTS), and/or Long-Term Evolution (LTE). The package (e.g., 108) may be configured to transmit and receive signals having different frequencies and/or communication protocols.

As will be further described below, the integrated device 105 may include a plurality of plate interconnects and at least one magnetic layer. The plate interconnects and the at least one magnetic layer is configured to improve resistance (e.g., reduce resistance) of a current passing through the integrated device 105 and improve the inductance and/or quality factor of an inductor that is located in and/or surrounded by a magnetic layer. With improved resistance and improved inductor performance, smaller and more compact inductors may be formed in the integrated device 105.

The integrated device 105 may be a first integrated device. In some implementations, the integrated device 105 may include an integrated passive device. The integrated device 103 may be a second integrated device. As will be further described below, the integrated device 105 may be configured as voltage regulator (e.g., integrated voltage regulator). As mentioned above, the integrated device 103 may be configured as a power management integrated device. The integrated device 103 may be configured as a voltage regulator and/or part of a voltage regulator. The integrated device 107 may be a third integrated device. The integrated device 107 may include a system on chip (SoC). The integrated device 107 may include a processor.

The integrated device 105 may be configured to be electrically coupled to the integrated device 103 through an electrical path 194 (e.g., first electrical path). The integrated device 105 may be configured to be electrically coupled to the integrated device 107 through an electrical path 196 (e.g., second electrical path). An electrical path (e.g., third electrical path) 198 may be coupled to the integrated device 103.

The electrical path 194 may be configured as an electrical path for power between the integrated device 103 and the integrated device 105. A power (e.g., first power) traveling through the electrical path 194 may have a voltage (e.g., first voltage). In some implementations, the first voltage may be in a range between 1-5 volts (V). The electrical path 194 may include at least one solder interconnect from the plurality of solder interconnects 130, at least one board interconnect from the plurality of board interconnects 112, at least one solder interconnect from the plurality of solder interconnects 124, at least one interconnect from the plurality of interconnects 122, and at least one solder interconnect from the plurality of solder interconnects 150. The electrical path 194 may also include at least one pillar interconnect from the plurality of pillar interconnects 152.

The electrical path 196 may be configured as an electrical path for power between the integrated device 105 and the integrated device 107. A power (e.g., second power) traveling through the electrical path 196 may have a voltage (e.g., second voltage). The second voltage may be different from the first voltage. The second voltage may be less than the first voltage. In some implementations, the second voltage may be about 1 volt (V) or less. The electrical path 196 may include at least one solder interconnect from the plurality of solder interconnects 150, at least one interconnect from the plurality interconnects 122 and at least one solder interconnect from the plurality of solder interconnects 170. The electrical path 196 may also include at least one pillar interconnect from the plurality of pillar interconnects 152 and/or at least one pillar interconnect from the plurality of pillar interconnects 172.

The electrical path 198 may extend through the board interconnects 112 and the plurality of solder interconnects 130. The electrical path 198 may be configured to provide an electrical path for power having a voltage (e.g., third voltage). The third voltage traveling through the electrical path 198 may be greater than the second voltage traveling through the electrical path 194. In some implementations, the first voltage may be about 5 volts (V) or greater.

As will be further described below, the integrated device 105 includes an inductor and a magnetic material. The integrated device 105 may include an integrated passive device. The integrated device 105 may include an active portion that includes transistors. The inductor of the integrated device 105 may be defined by a plurality of interconnects that include a plurality of plate interconnects.

Figure 2:
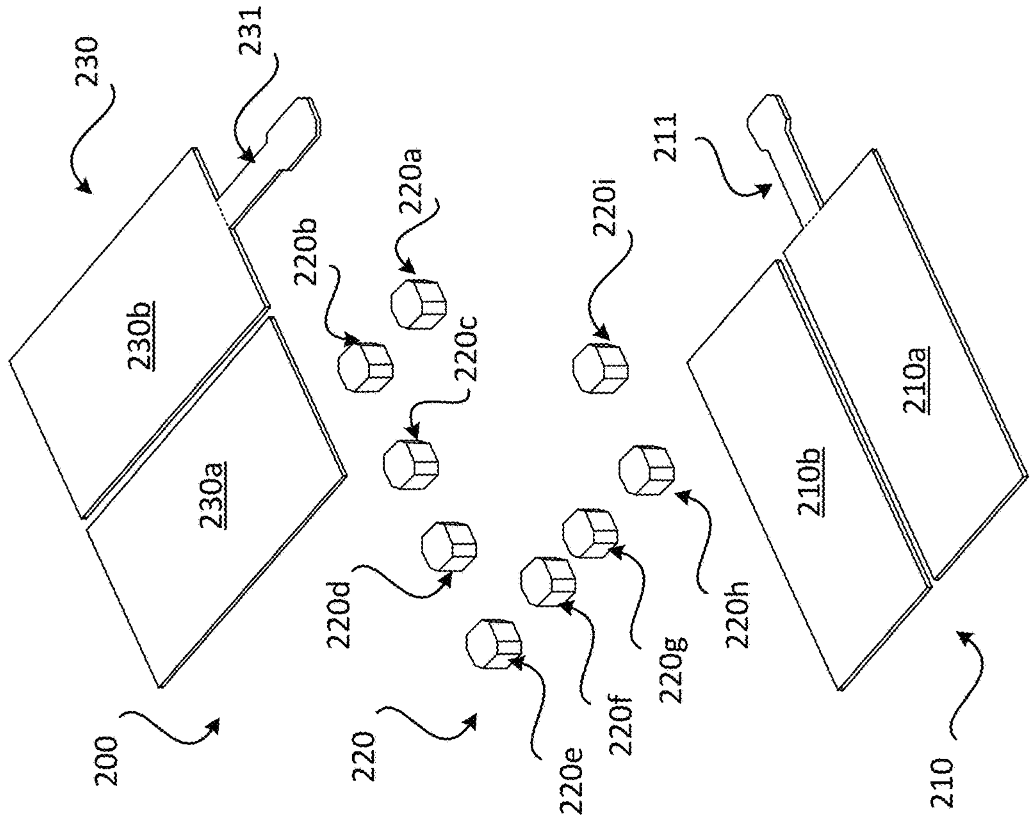
FIG. 2 illustrates an exemplary view of an integrated device that includes plate interconnects and magnetic material that surrounds interconnects.

FIG. 2 illustrates an inductor 200 that may be implemented in the integrated device 105. The inductor 200 includes a first plurality of plate interconnects 210, a plurality of via interconnects 220 and a second plurality of plate interconnects 230. The first plurality of plate interconnects 210 are coupled to the plurality of via interconnects 220. The second plurality of plate interconnects 230 are coupled to the plurality of via interconnects 220. The plurality of via interconnects 220 are located between the first plurality of plate interconnects 210 and the second plurality of plate interconnects 230. Although not shown, a magnetic layer may be located between the first plurality of plate interconnects 210 and the second plurality of plate interconnects 230. The magnetic layer may laterally surround the plurality of via interconnects 220. A magnetic layer is further described below in at least FIG. 8.

The first plurality of plate interconnects 210 are located on a first metal layer, and the second plurality of plate interconnects 230 are located on a second metal layer. The first metal layer may be located above the second metal layer. In some implementations, the second metal layer may be located above the first metal layer. The plurality of via interconnects 220 includes a via interconnect 220*a*, a via interconnect 220*b*, a via interconnect 220*c*, a via interconnect 220*d*, a via interconnect 220*e*, a via interconnect 220*f*, a via interconnect 220*g*, a via interconnect 220*h*, and a via interconnect 220*i*. Different implementations may have different number of via interconnects.

The first plurality of plate interconnects 210 includes a plate interconnect 210*a* (e.g., first plate interconnect) and a plate interconnect 210*b* (e.g., second plate interconnect). The first plurality of plate interconnects 210 are aligned in a first direction. The second plurality of plate interconnects 230 includes a plate interconnect 230*a* (e.g., first plate interconnect) and a plate interconnect 230*b* (e.g., second plate interconnect). The second plurality of plate interconnects 230 are aligned in a second direction that is different from the first direction. In some implementations, the second direction is orthogonal to the first direction. A trace interconnect 211 is coupled to the plate interconnect 210*a*. A trace interconnect 231 is coupled to the plate interconnect 230*b*. Different implementations may have different number of plate interconnects and/or plate interconnects that are arranged and/or aligned in different directions.

A plate interconnect is an interconnect that has a width that is at least twice as wide as the width of a trace interconnect. For example, one of the plate interconnects (e.g., 210*a*, 210*b*) may have a first width, one of the plate interconnects (e.g., 230*a*, 230*b*) may have a second width, and a trace may have a trace width, where the first width and/or the second width has a width that is at least twice as wide as the trace width. A via interconnect may have a via width (e.g., via diameter). In some implementations, the first width and/or the second width of a plate interconnect has a width that is at least twice as wide as the via width. In some implementations, the via interconnects and/or the plate interconnects may have variable widths. In some implementations, a plate interconnect may have a width in a ranged of about 300-400 micrometers. In some implementations, a via interconnect may have a via width that is 100 micrometers or less (e.g., about 50-100 micrometers). In some implementations, a trace interconnect may have a trace width that is 100 micrometers or less. However, different implementations may use different widths for the plate interconnects, the via interconnects, and/or the trace interconnects. The via interconnects may have an aspect ratio of between 1:1 and 2:1. An aspect ratio is a height to width ratio. In some implementations, a via interconnect may have a height in a range of about 75-100 micrometers. However, different implementations may use different heights and/or aspect ratio for the via interconnects.

The plate interconnect 210*a* may be coupled to the via interconnect 220*g*, the via interconnect 220*h*, and the via interconnect 220*i*. The plate interconnect 230*a* may be coupled to the via interconnect 220*g*, the via interconnect 220*h*, and the via interconnect 220*i*. The plate interconnect 230*a* may be coupled to the via interconnect 220*d*, the via interconnect 220*e*, and the via interconnect 220*f*. The plate interconnect 210*b* may be coupled to the via interconnect 220*d*, the via interconnect 220*e*, and the via interconnect 220*f*. The plate interconnect 210*b* may be coupled to the via interconnect 220*a*, the via interconnect 220*b*, and the via interconnect 220*c*. The plate interconnect 210*a* may be coupled to the via interconnect 220*a*, the via interconnect 220*b*, and the via interconnect 220*c*. The trace interconnect 211 may be coupled to the plate interconnect 210*a*. The trace interconnect 231 may be coupled to the plate interconnect 230*b*.

Figure 3:
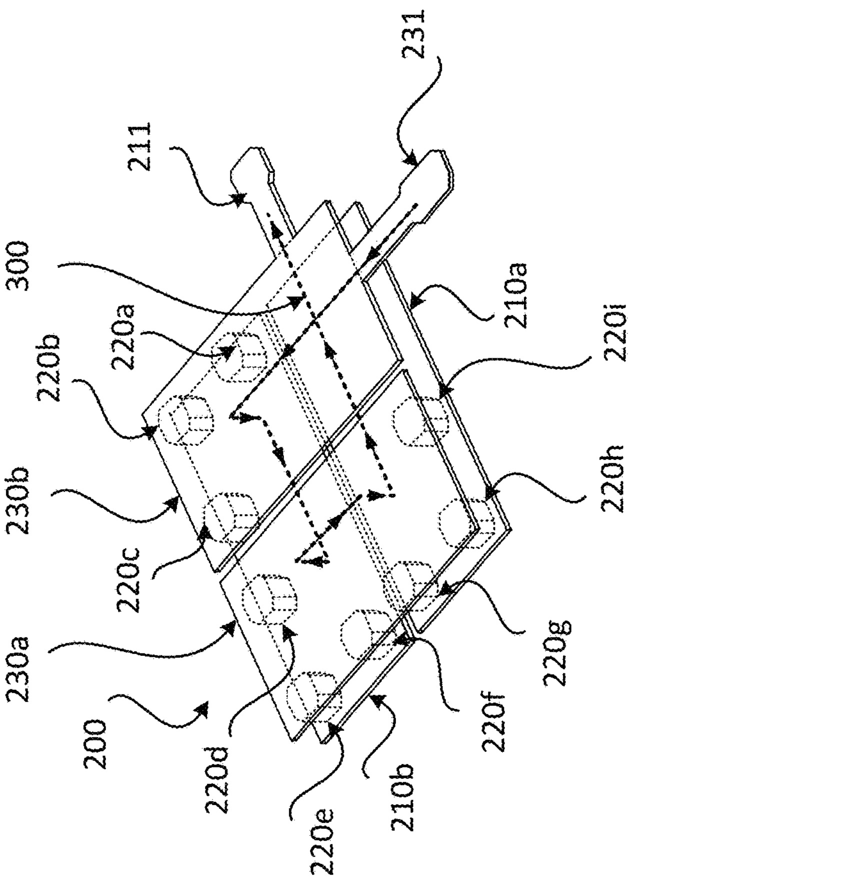
FIG. 3 illustrates an exemplary angled view of an integrated device that includes plate interconnects and magnetic material that surrounds interconnects.

FIG. 3 illustrates an example of an electrical path 300 through the inductor 200. The electrical path 300 through the inductor 200 may include the plate interconnect 230*b*, the via interconnect 220*a*, the via interconnect 220*b*, the via interconnect 220*c*, the plate interconnect 210*b*, the via interconnect 220*d*, the via interconnect 220*e*, the via interconnect 220*f*, the plate interconnect 230*a*, the via interconnect 220*g*, the via interconnect 220*h*, the via interconnect 220*i*, and the plate interconnect 210*a*. A current (e.g., power) may enter the inductor 200 through the trace interconnect 231 and exit through the trace interconnect 211. In some implementations, a current (e.g., power) may enter the inductor 200 through the trace interconnect 211 and exit through the trace interconnect 231.

Figure 5:
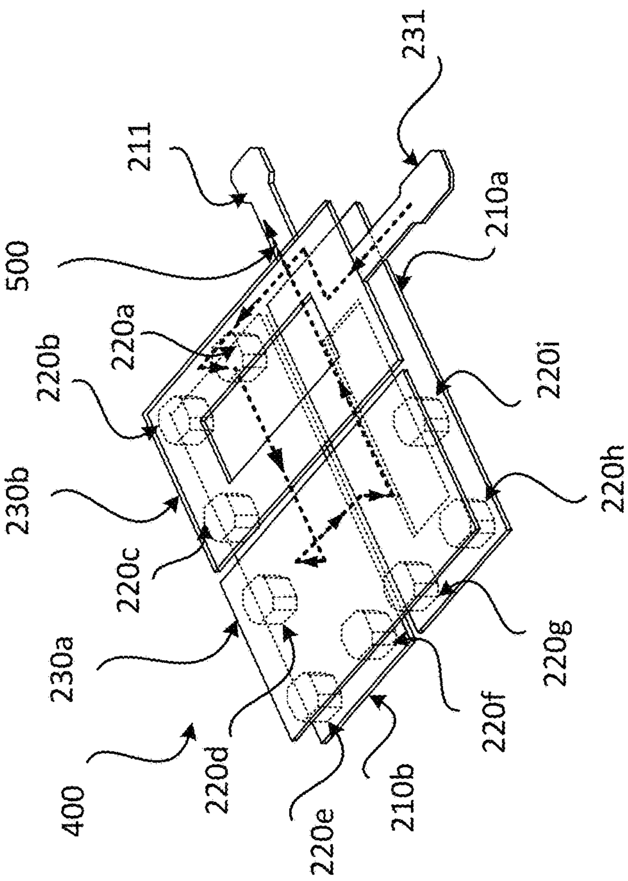
FIG. 5 illustrates an exemplary angled view of an integrated device that includes plate interconnects with a slot, and magnetic material that surrounds interconnects.
Figure 4:
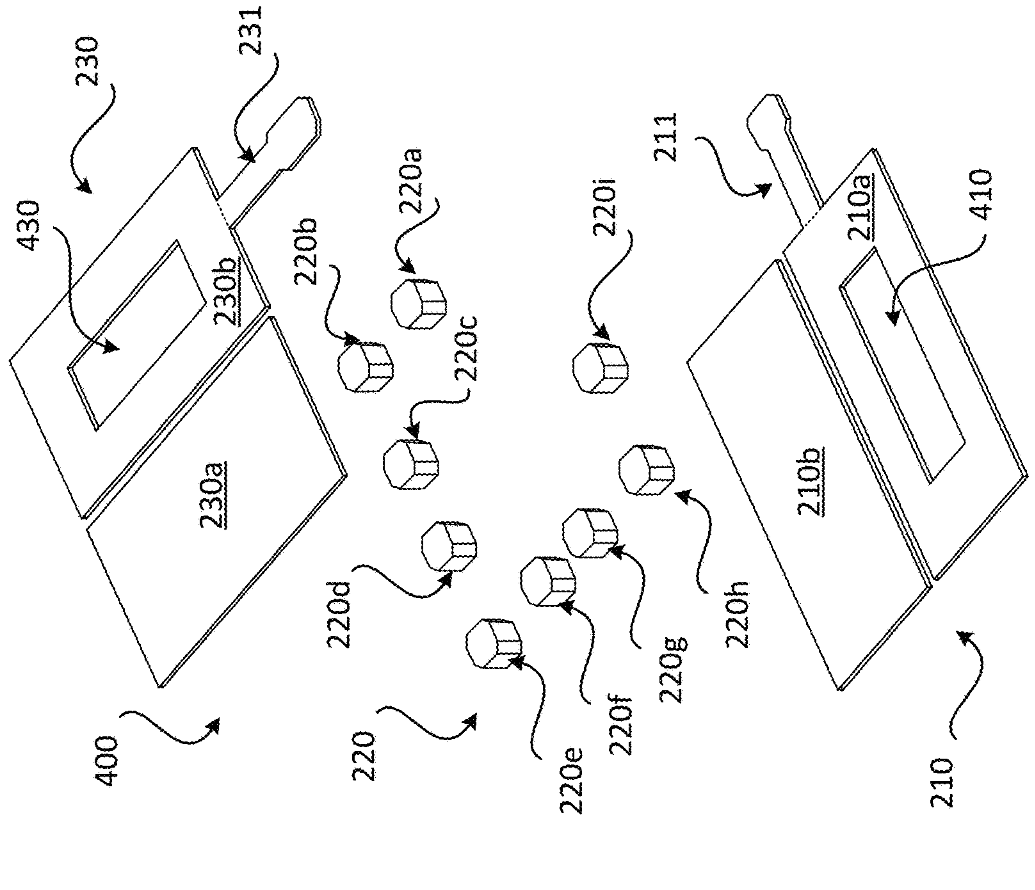
FIG. 4 illustrates an exemplary view of an integrated device that includes plate interconnects with a slot, and magnetic material that surrounds interconnects.

FIGS. 4 and 5 illustrate an inductor with a different design that provides improved inductance. FIG. 4 illustrates an inductor 400 that may be implemented in the integrated device 105. The inductor 400 is similar to the inductor 200 of FIG. 2. The inductor 400 includes the first plurality of plate interconnects 210, the plurality of via interconnects 220 and the second plurality of plate interconnects 230. FIG. 4 illustrates that the plate interconnect 210*a* includes a slot 410 and the plate interconnect 230*b* includes a slot 430. The slot 410 and/or the slot 430 may be filed with a dielectric layer. In some implementations, other plate interconnects may have their own respective slot. In some implementations, a plate interconnect may have more than one slot. Different slots may have different sizes and/or shapes. The use of one or more slots helps improve the inductance of the inductor 400.

The first plurality of plate interconnects 210 of the inductor 400 are coupled to the plurality of via interconnects 220 of the inductor 400 in a similar manner as described for the inductor 200. The second plurality of plate interconnects 230 of the inductor 400 are coupled to the plurality of via interconnects 220 of the inductor 400 in a similar manner as described for the inductor 200.

The plate interconnect 210*a* may be coupled to the via interconnect 220*g*, the via interconnect 220*h*, and the via interconnect 220*i*. The plate interconnect 230*a* may be coupled to the via interconnect 220*g*, the via interconnect 220*h*, and the via interconnect 220*i*. The plate interconnect 230*a* may be coupled to the via interconnect 220*d*, the via interconnect 220*e*, and the via interconnect 220*f*. The plate interconnect 210*b* may be coupled to the via interconnect 220*d*, the via interconnect 220*e*, and the via interconnect 220*f*. The plate interconnect 210*b* may be coupled to the via interconnect 220*a*, the via interconnect 220*b*, and the via interconnect 220*c*. The plate interconnect 210*a* may be coupled to the via interconnect 220*a*, the via interconnect 220*b*, and the via interconnect 220*c*. The trace interconnect 211 may be coupled to the plate interconnect 210*a*. The trace interconnect 231 may be coupled to the plate interconnect 230*b*.

FIG. 5 illustrates an example of an electrical path 500 through the inductor 400. The electrical path 500 through the inductor 400 may include the plate interconnect 230*b*, the via interconnect 220*a*, the via interconnect 220*b*, the via interconnect 220*c*, the plate interconnect 210*b*, the via interconnect 220*d*, the via interconnect 220*e*, the via interconnect 220*f*, the plate interconnect 230*a*, the via interconnect 220*g*, the via interconnect 220*h*, the via interconnect 220*i*, and the plate interconnect 210*a*. A current (e.g., power) may enter the inductor 200 through the trace interconnect 231 and exit through the trace interconnect 211. In some implementations, a current (e.g., power) may enter the inductor 200 through the trace interconnect 211 and exit through the trace interconnect 231.

Figure 6:
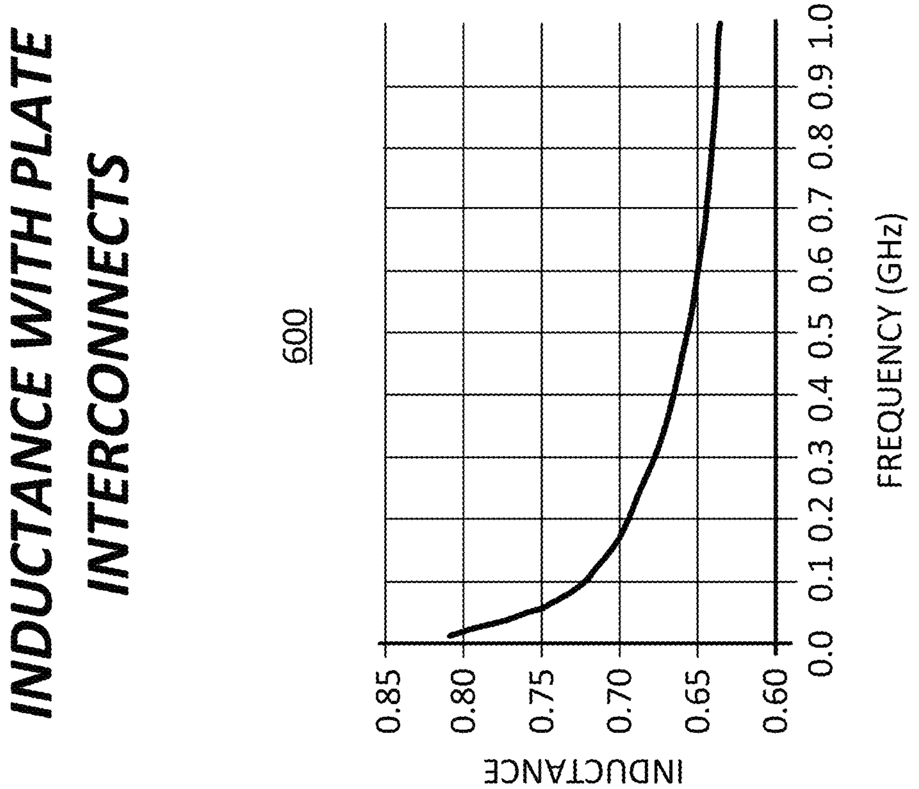
FIG. 6 illustrates an exemplary graph of inductance of an inductor with plate interconnects and a magnetic material.
Figure 7:
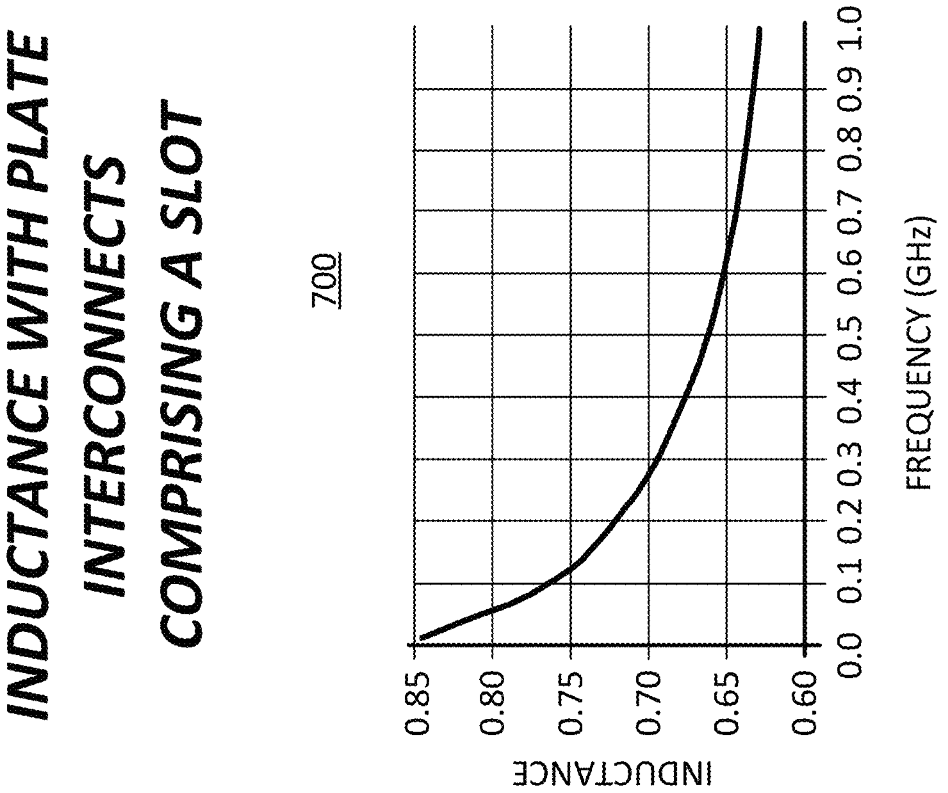
FIG. 7 illustrates an exemplary graph of inductance of an inductor with plate interconnects with a slot, and a magnetic material.

FIGS. 6 and 7 illustrate graphs that show how inductance is improved through the use of slots in a plate interconnect. FIG. 6 illustrates an exemplary graph 600 that includes a plot line of inductance through various frequency for the inductor 200. FIG. 7 illustrates an exemplary graph 700 that includes a plot line of inductance through various frequency for the inductor 400, which include a slot in a plate interconnect. As shown in FIGS. 6 and 7, for certain frequencies, the inductor 400 has a higher inductance than the inductor 200.

Figure 8:
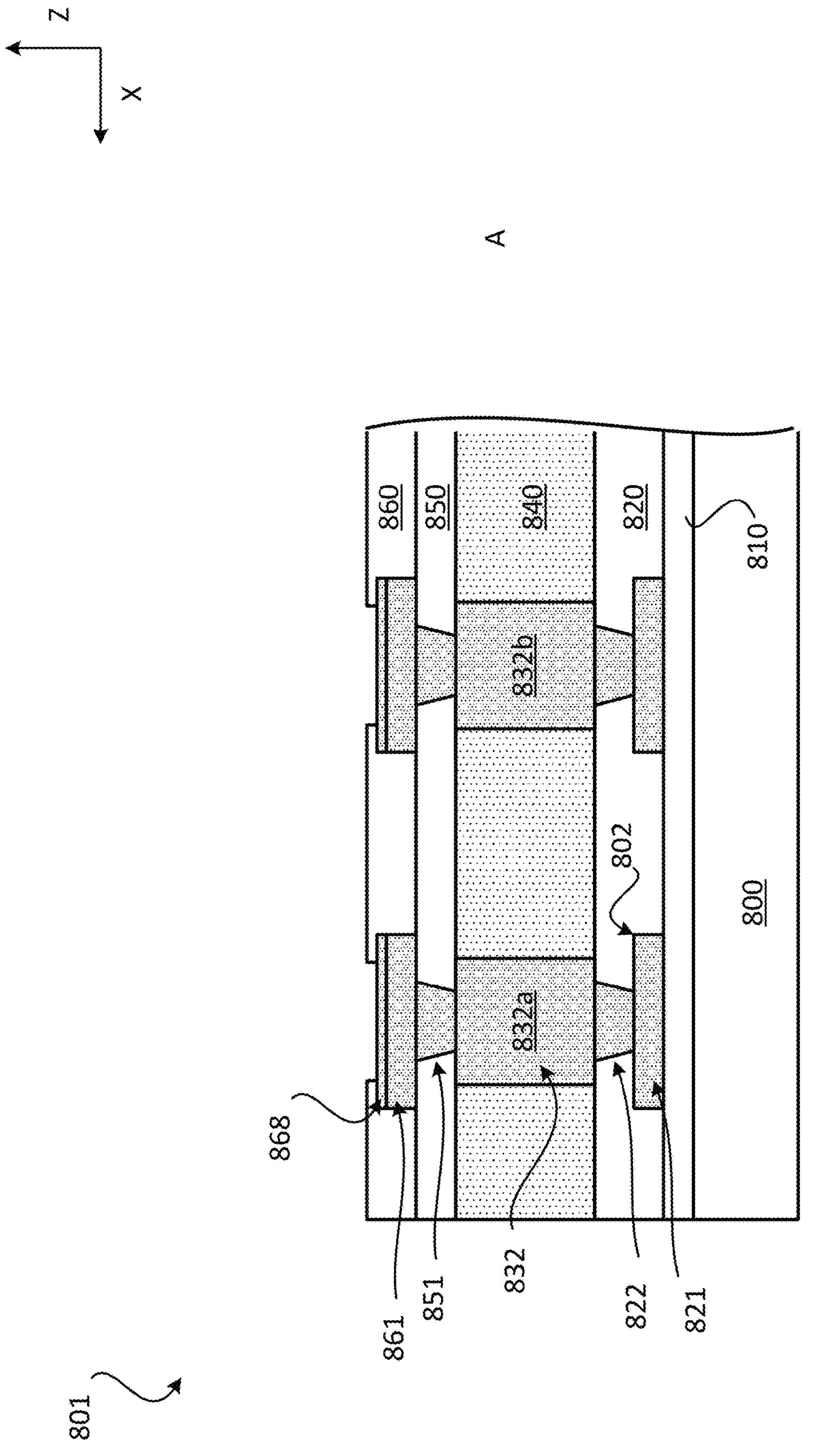
FIG. 8 illustrates an exemplary profile view of an integrated device that includes plate interconnects and magnetic material that surrounds interconnects.

FIG. 8 illustrates an exemplary profile cross sectional view of an integrated device 801. The integrated device 801 may be an integrated passive device. The integrated device 801 includes a die substrate 800, a dielectric layer 810, a dielectric layer 820, a dielectric layer 850, a dielectric layer 860, at least one magnetic layer 840. The integrated passive device 801 may also include a plurality of interconnects 802. The plurality of interconnects 802 may include at least one interconnect 821, at least one interconnect 822, at least one interconnect 832, at least one interconnect 851, at least one interconnect 861 and/or at least one interconnect 862. As will be further described below, at least some of the interconnects from the plurality of interconnects 802 are configured to operate as an inductor. The integrated device 801 may be an example of the integrated device 105.

Some of the at least one interconnect 832 may correspond to the plurality of via interconnects 230. In some implementations, some of the at least one interconnect 832, the at least one interconnect 822 and/or the at least one interconnect 851 may correspond to the plurality of via interconnects 230. Some of the at least one interconnect 821 may correspond to the first plurality of plate interconnects 210. Some of the at least one interconnect 861 may correspond to the second plurality of plate interconnects 230.

In some implementations, some of the at least one interconnect 861 may correspond to the first plurality of plate interconnects 210 and/or some of the at least one interconnect 821 may correspond to the second plurality of plate interconnects 230.

The die substrate 800 may include silicon (Si). The die substrate 800 may include a wafer. The die substrate 800 may be free of transistors. The dielectric layer 810 is coupled to a surface of the die substrate 800. The dielectric layer 810, the dielectric layer 820, the dielectric layer 850, and the dielectric layer 860 may be represented as one or more dielectric layers. Thus, in some implementations, one dielectric layer may represent the dielectric layer 810, the dielectric layer 820, the dielectric layer 850, and/or the dielectric layer 860. In some implementations, there may be a dielectric layer that laterally surrounds and touches a side surface of the at least one interconnect 832 (e.g., 832*a*, 832*b*). In such instances, the dielectric layer may be located between the side surface of the at least one interconnect 832 and the at least one magnetic layer 840. In some implementations, two or more dielectric layers may represent the dielectric layer 810, the dielectric layer 820, the dielectric layer 850, and/or the dielectric layer 860. The dielectric layer 810, the dielectric layer 820, the dielectric layer 850, and/or the dielectric layer 860 may include one or more polyimide (PI). In some implementations, the dielectric layer 860 may include a passivation layer.

The at least one interconnect 821 is located over the dielectric layer 810. The at least one interconnect 822 is coupled to the at least one interconnect 832 and the at least one interconnect 821. The at least one interconnect 832 is coupled to the at least one interconnect 851. The at least one interconnect 851 is coupled to the at least one interconnect 861. The at least one interconnect 861 is coupled to the at least one interconnect 862. The at least one interconnect 821, the at least one interconnect 822, the at least one interconnect 832, the at least one interconnect 851, and the at least one interconnect 861 may include copper. In some implementations, the at least one interconnect 862 may include nickel and/or gold. The at least one interconnect 821, at least one interconnect 822, at least one interconnect 832, at least one interconnect 851, at least one interconnect 861, and/or at least one interconnect 862 may be configured to operate as an inductor (e.g., solenoid inductor).

The plurality of interconnects 802 may include a plurality of metallization interconnects. That is for example, in some implementations, at least some of the interconnects from the plurality of interconnects 802 may be implemented as a plurality of metallization interconnects. A plurality of metallization interconnects may include a plurality of redistribution interconnects (e.g., redistribution layer (RDL) interconnects). The at least one interconnect 832 includes an interconnect 832*a* and an interconnect 832*b*. The interconnect 832*b* is planar to the interconnect 832*a*. The interconnect 832*a* may be a via interconnect (e.g., first via interconnect). The interconnect 832*b* may be a via interconnect (e.g., second via interconnect).

As mentioned above, the integrated device 801 includes at least one magnetic layer 840. The at least one magnetic layer 840, laterally surrounds and touches the interconnect 832*a* and/or laterally surrounds and touches the interconnect 832*b*. In some implementations, there may be a dielectric layer that is between the interconnect (e.g., 832_a_, 832_b_) and the at least one magnetic layer 840. Thus, in some implementations, the at least one magnetic layer 840 may not directly touch the plurality of interconnects 832.

The at least one magnetic layer 840 may include one or more magnetic layers. The at least one magnetic layer 840 includes an insulating layer, a dielectric layer and/or a non-electrical conducting material (e.g., material that does not electrically conduct). The at least one magnetic layer 840 may be both a dielectric material and a magnetic material. Thus, the at least one magnetic layer 840 may have both dielectric properties and magnetic properties. The at least one magnetic layer 840 may include one or more materials. The at least one magnetic layer 840 has a permeability value that is greater than 1 (e.g., about 10 or greater, range of 6-12). The magnetic layer 840 may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0=4\pi\times10^{-7}$ H/m (Henry per meter). A material that has a relative permeability value that is greater than 1 may be considered to be a magnetic material. Similarly, a material layer that has a relative permeability value that is greater than 1 may be considered to be a magnetic layer. The at least one magnetic layer 840 may include a magnetic loss tangent value that is in a range of about 0.01-0.04. For example, the at least one magnetic layer may include a magnetic loss tangent value that is in a range of about 0.01-0.04 for frequencies up to 100 MHz. The at least one magnetic layer 840 may include may include various magnetic materials. For example, the at least one magnetic layer 840 may include Ajinomoto Magnetic Film (AMF). The at least one magnetic layer 840 is configured to improve the inductance and/or quality factor of an inductor that is located in and/or surrounded by the at least one magnetic layer 840. With improved inductor performance, smaller and more compact inductors may be formed in the integrated passive device and/or the integrated device.

Figure 9:
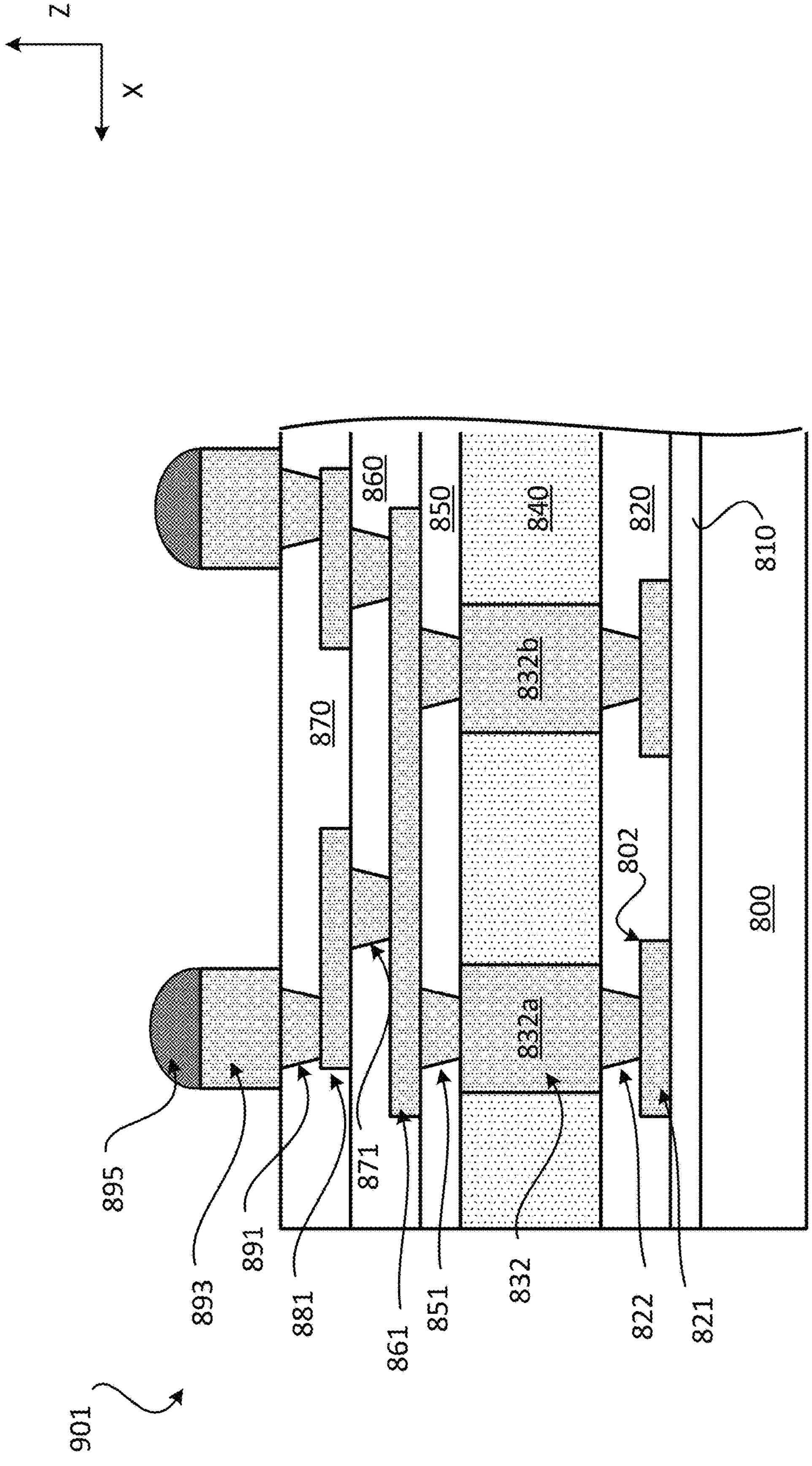
FIG. 9 illustrates an exemplary profile view of an integrated device that includes plate interconnects and magnetic material that surrounds interconnects.

FIG. 9 illustrates an exemplary profile cross sectional view of an integrated device 901. The integrated device 901 may be similar to the integrated device 801. The integrated device 901 includes additional metal layer of interconnects. The integrated device 901 may represent the integrated device 105.

The integrated device 901 includes a die substrate 800, a dielectric layer 810, a dielectric layer 820, a dielectric layer 850, a dielectric layer 860, a dielectric layer 870 at least one magnetic layer 840. The integrated passive device 801 may also include a plurality of interconnects 802. The plurality of interconnects 802 may include at least one interconnect 821, at least one interconnect 822, at least one interconnect 832, at least one interconnect 851, at least one interconnect 861, at least one interconnect 871, at least one interconnect 881, and/or at least one interconnect 891. As will be further described below, at least some of the interconnects from the plurality of interconnects 802 are configured to operate as an inductor. The integrated device 901 includes a plurality of pillar interconnects 893 coupled to the at least one interconnects 891. A plurality of solder interconnects 895 are coupled to the plurality of pillar interconnects 893. In some implementations, there may be a dielectric layer that laterally surrounds and touches a side surface of the at least one interconnect 832 (e.g., 832_a_, 832_b_). In such instances, the dielectric layer may be located between the side surface of the at least one interconnect 832 and the at least one magnetic layer 840.

Some of the at least one interconnect 832 may correspond to the plurality of via interconnects 230. In some implementations, some of the at least one interconnect 832, the at least one interconnect 822, and/or the at least one interconnect 851 may correspond to the plurality of via interconnects 230. Some of the at least one interconnect 821 may correspond to the first plurality of plate interconnects 210. Some of the at least one interconnect 861 may correspond to the second plurality of plate interconnects 230.

In some implementations, some of the at least one interconnect 861 may correspond to the first plurality of plate interconnects 210 and/or some of the at least one interconnect 821 may correspond to the second plurality of plate interconnects 230.

In some implementations, the integrated device 801 and/or the integrated device 901 may include an active portion located in and/or over the die substrate (e.g., 800). The active portion may include at least part of the die substrate 800 and a plurality of transistors. The plurality of transistors may be formed and/or located in and/or over the die substrate 800. The die substrate 800 may include silicon (Si). The plurality of transistors may form and/or define one or more logical blocks. The plurality of transistors may be any type of transistors (e.g., CMOS transistors, planar transistors, field effect transistors).

An integrated device (e.g., 103, 105, 107) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105, 107) may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Having described various integrated devices and/or integrated passive devices with at least one magnetic layer, a process for fabricating an integrated device with at least one magnetic layer will be described below.

Exemplary Sequence for Fabricating an Integrated Device Comprising a Plate Interconnect and Magnetic Layer FIGS. 10A-10E illustrate an exemplary sequence for providing or fabricating an integrated device comprising at least one magnetic layer. In some implementations, the sequence of FIGS. 10A-10E may be used to provide or fabricate the integrated device 105 and/or the integrated device 801 described in the disclosure. In some implementations, the sequence of FIGS. 10A-10E may be used to provide or fabricate the integrated device 105 and/or the integrated device 901 described in the disclosure.

It should be noted that the sequence of FIGS. 10A-10E may combine one or more stages in order to simplify and/or clarify the sequence for providing or fabricating an integrated device. In some implementations, the order of the processes may be changed or modified. In some implementations, one or more of processes may be replaced or substituted without departing from the spirit of the disclosure. Different implementations may fabricate an integrated device differently. The sequence shown in FIGS. 10A-10E may be implemented on a wafer (e.g., silicon wafer) and then singulated into several integrated devices. A similar approach may be implemented for integrated devices with plate interconnects and a magnetic layer.

Figure 10A:
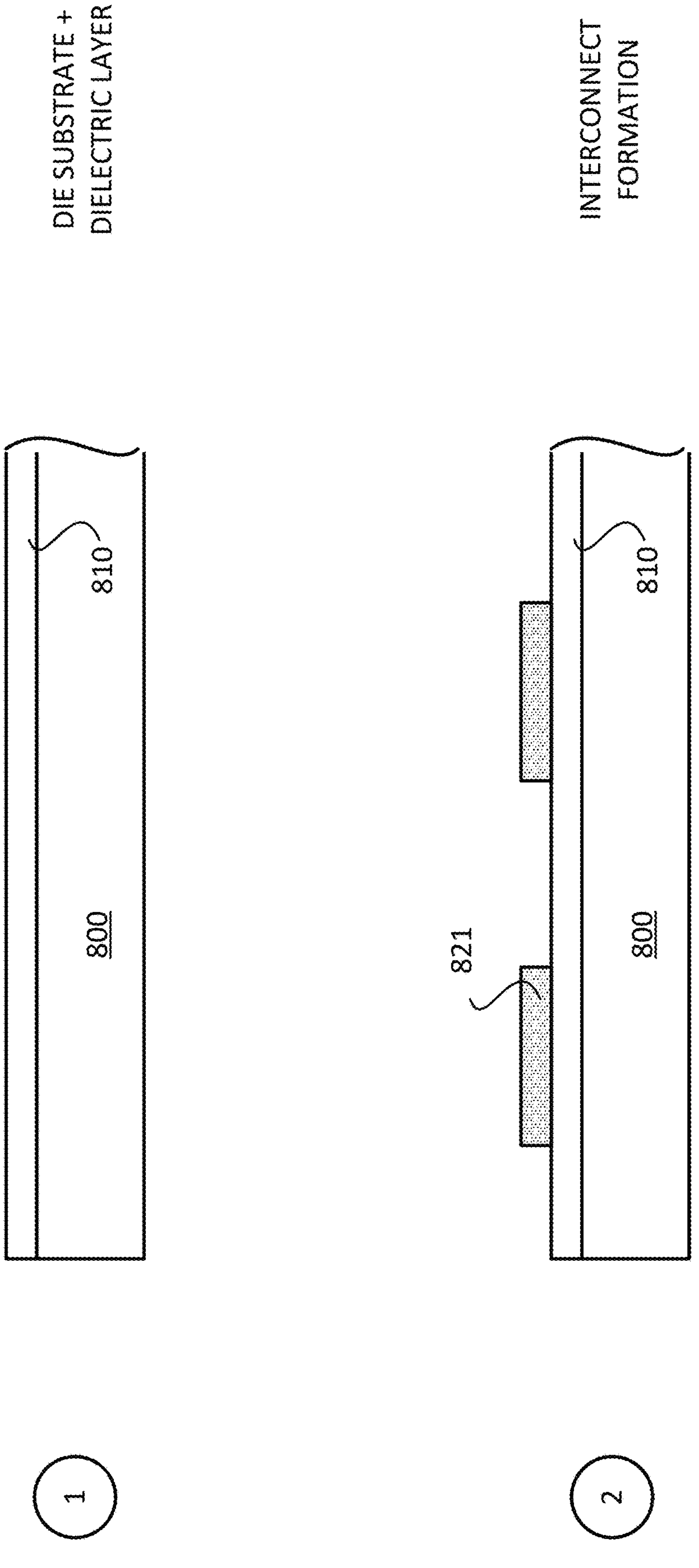
FIGS. 10A-10E illustrate an exemplary sequence for fabricating an integrated device that includes plate interconnects and a magnetic material.

Stage 1, as shown in FIG. 10A, illustrates a state after a die substrate 800 is provided. The die substrate 800 may include silicon (Si). A dielectric layer 810 may be located over a surface of the die substrate 800. The die substrate 800 may be provided with the dielectric layer 810. In some implementations, the dielectric layer 810 may be formed over the surface of the die substrate 800. Providing the die substrate 800 may include providing a wafer (e.g., silicon wafer). In some implementations, a die substrate 800 may be provided with a plurality of transistors.

Stage 2 illustrates a state after at least one interconnect 821 is formed over the dielectric layer 810. A plating process and a patterning process may be used to form the at least one interconnect 821.

Figure 10B:
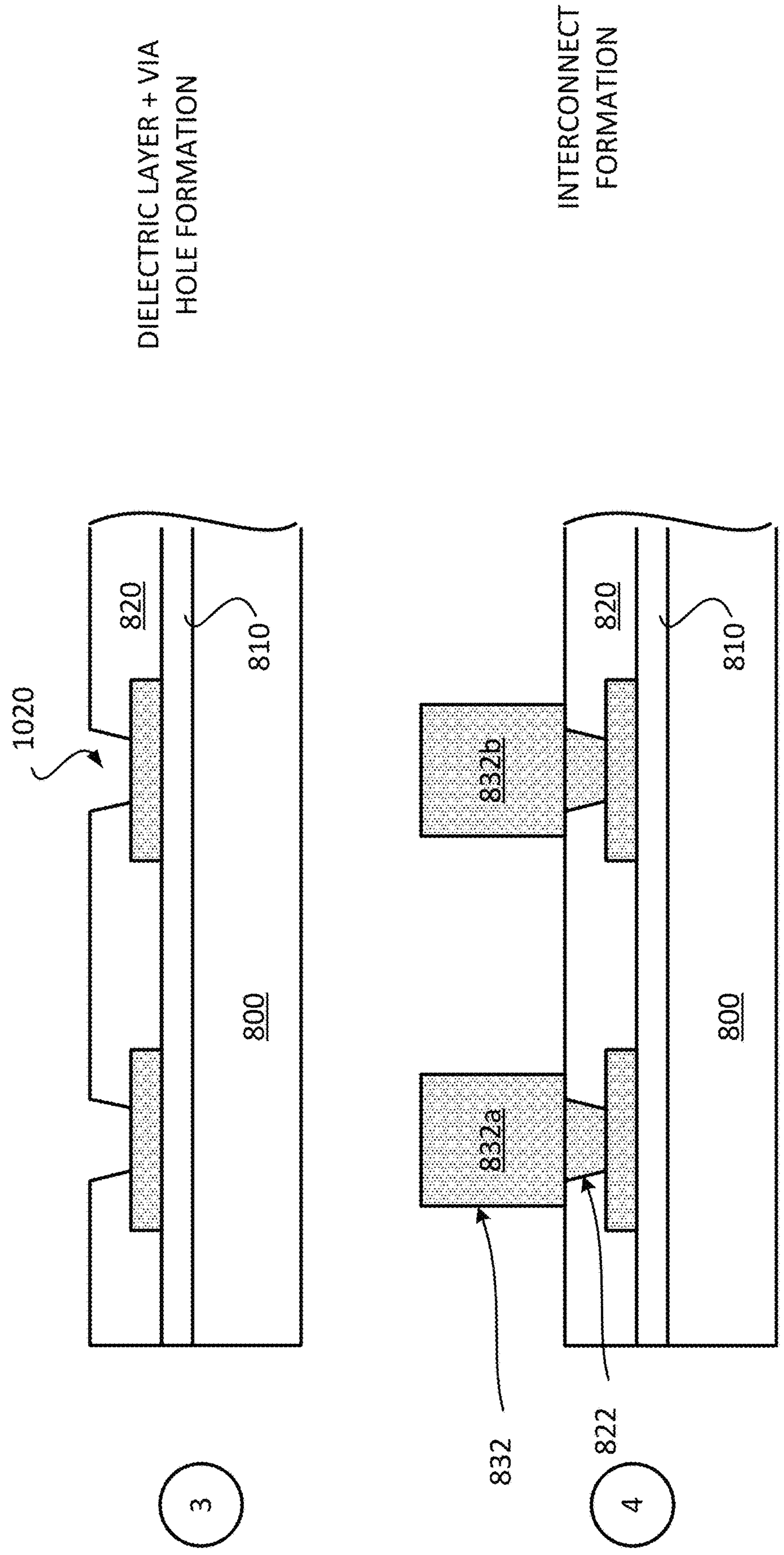

Stage 3, as shown in FIG. 10B, illustrates a state after at least one dielectric layer 820 is formed and patterned. A deposition, a lamination, an exposure, a development and/or an etching process may be used to form and pattern the at least one dielectric layer 820. The at least one dielectric layer 820 may be formed over and around the at least one interconnect 821. The at least one dielectric layer 820 may include at least one via-hole 1020.

Stage 4 illustrates a state after at least one interconnect 822 and at least one interconnect 832 are formed. A plating process and a patterning process may be used to form the at least one interconnect 822 and the at least one interconnect 832. Forming the at least one interconnect 822 may include forming via interconnects in the at least one via-hole 1020 of the at least one dielectric layer 820. The at least one interconnect 822 may be coupled to the at least one interconnect 821 and the at least one interconnect 832. The at least one interconnect 832 includes an interconnect 832*a* and an interconnect 832*b*. A width of the at least one interconnect 832 may be greater than a width of the at least one interconnect 822.

Figure 10C:
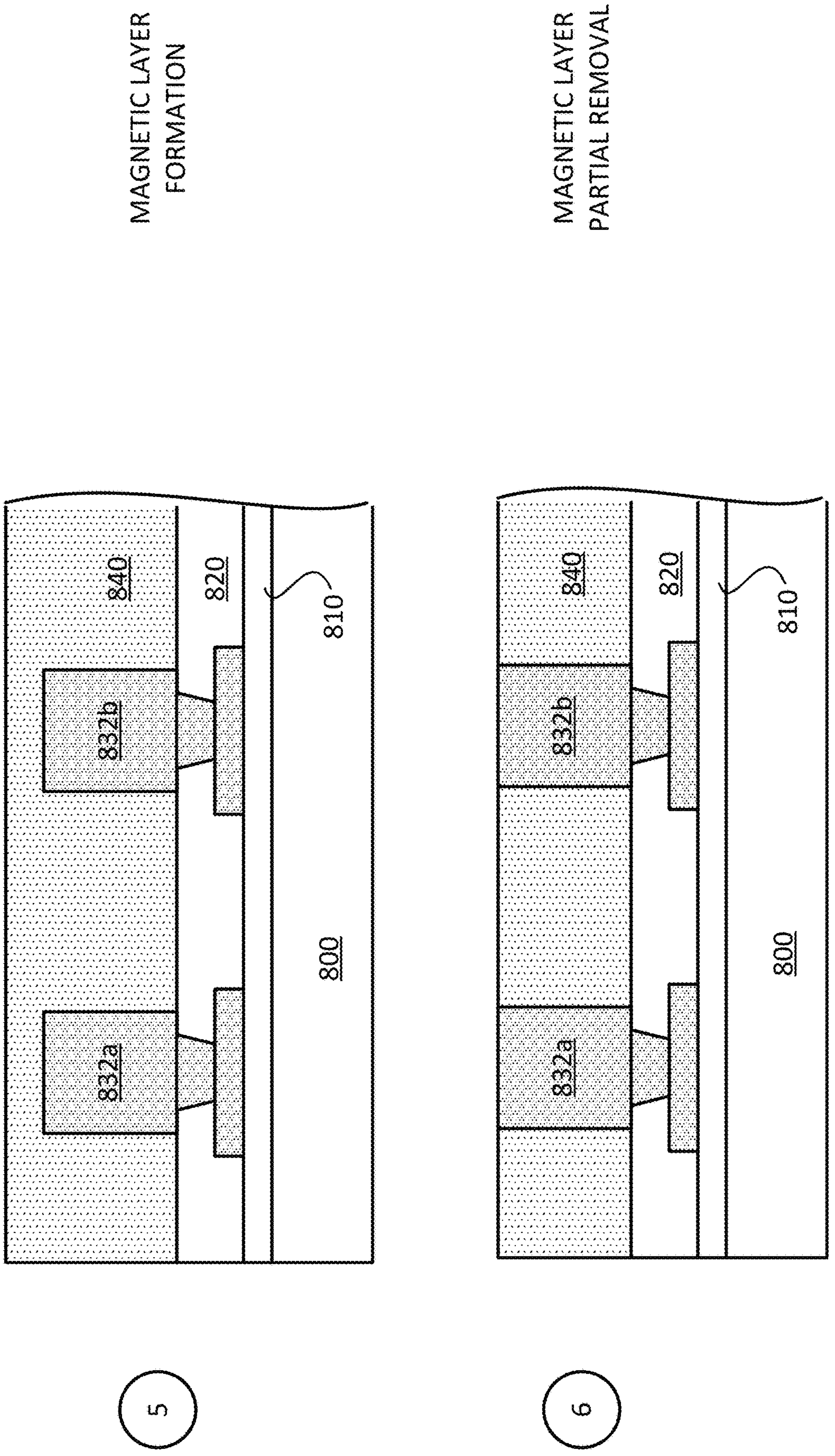

Stage 5, as shown in FIG. 10C, illustrates a state after a magnetic layer 840 is formed over the dielectric layer 820. A lamination process may be used to form the magnetic layer 840. A printing process may be used to form paste of the magnetic layer 840 over the dielectric layer 820.

Stage 6 illustrates a state after portions of the magnetic layer 840 are removed. A polishing process and/or a grinding process may be used to remove portions of the magnetic layer 840. Removing portions of the magnetic layer 840 exposes the at least one interconnect 832. It is noted that portions of the at least one interconnect 832 may also be removed through the polishing and/or grinding process.

Figure 10D:
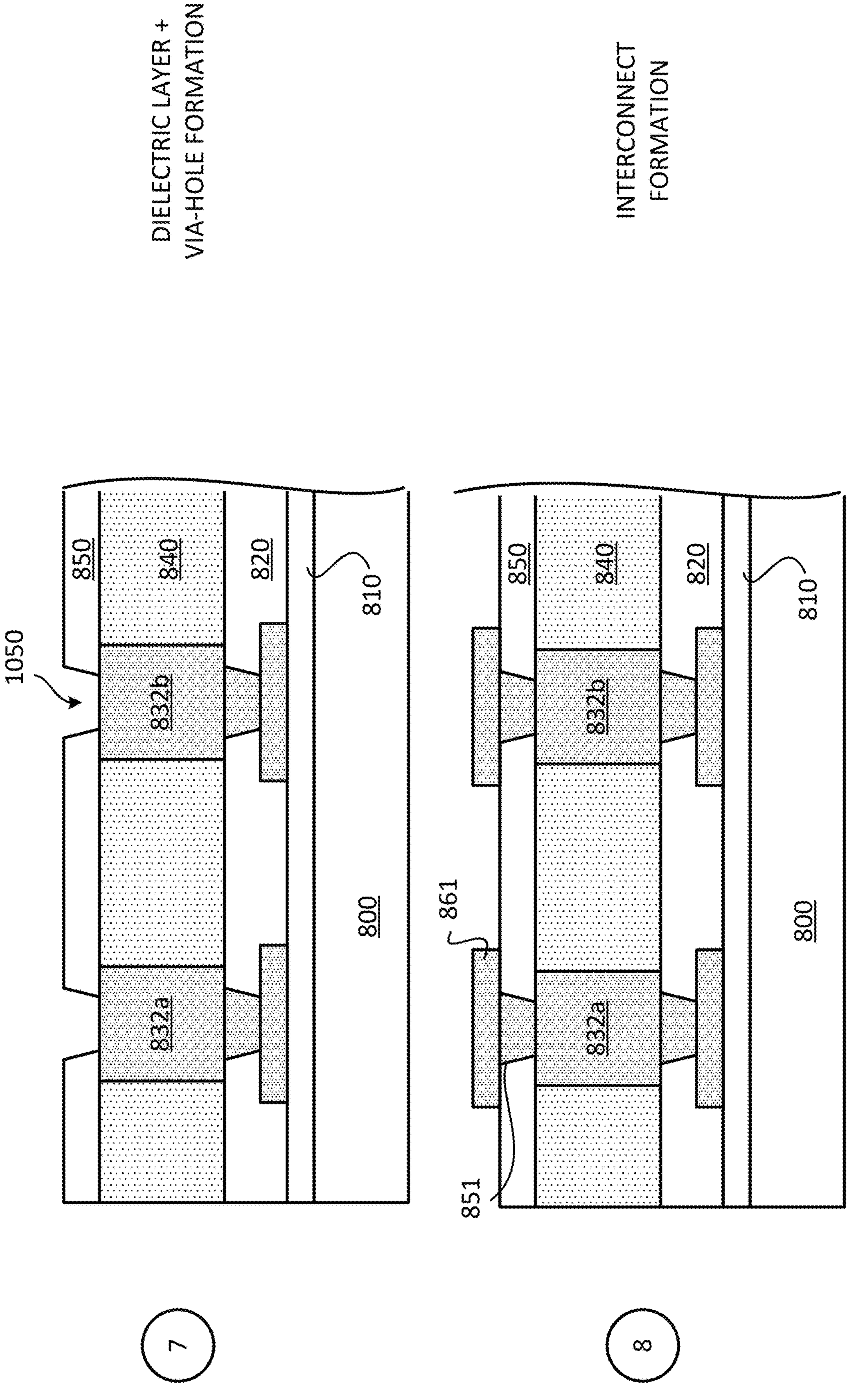

Stage 7, as shown in FIG. 10D, illustrates a state after at least one dielectric layer 850 is formed and patterned. A deposition, a lamination, an exposure, a development and/or an etching process may be used to form and pattern the at least one dielectric layer 850. The at least one dielectric layer 850 may be formed over and around the at least one interconnect 832 and the magnetic layer 840. The at least one dielectric layer 850 may include at least one via-hole 1050.

Stage 8 illustrates a state after the at least one interconnect 851 and at least one interconnect 861 are formed. A plating process and a patterning process may be used to form the at least one interconnect 851 and the at least one interconnect 861. Forming the at least one interconnect 851 may include forming via interconnects in the at least one via-hole 1050 of the at least one dielectric layer 850. The at least one interconnect 851 may be coupled to the at least one interconnect 832 and the at least one interconnect 861.

Figure 10E:
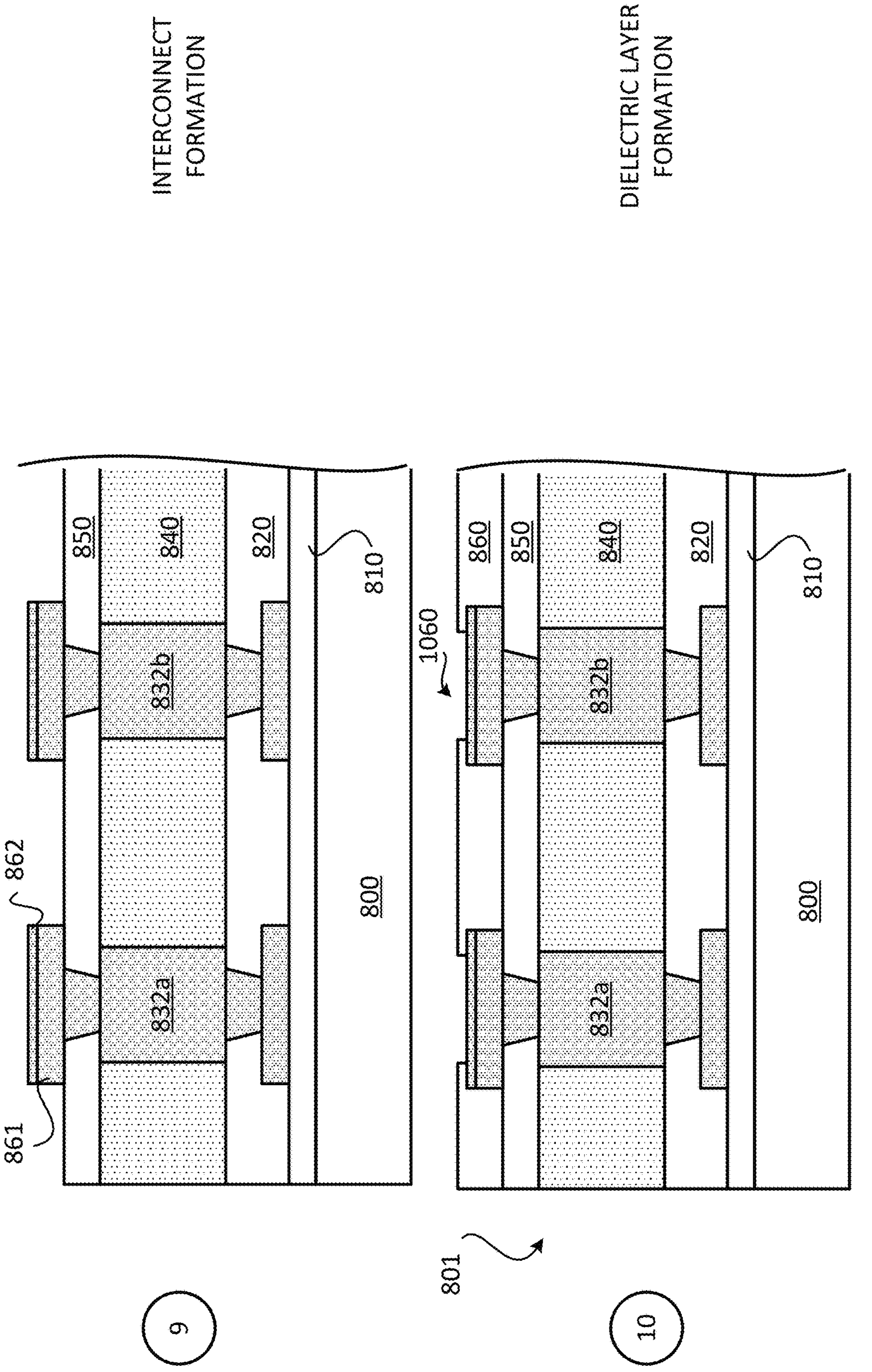

Stage 9, as shown in FIG. 10E, illustrates a state after the at least one interconnect 862 is formed. A plating process and a patterning process may be used to form the at least one interconnect 862. The at least one interconnect 862 is formed and coupled to the at least one interconnect 861. The at least one interconnect 862 may include nickel and/or gold.

Stage 10 illustrates a state after at least one dielectric layer 860 is formed and patterned. A deposition, a lamination, an exposure, a development and/or an etching process may be used to form and pattern the at least one dielectric layer 860. The at least one dielectric layer 860 may include at least one opening 1060, which is configured as an opening in the dielectric layer 860 and exposes the interconnect 861 and/or the interconnect 862. A solder interconnect may be configured to be coupled to the interconnect 862 and/or the interconnect 861 through the opening in the dielectric layer 860.

As mentioned above, the above sequence may be performed on a wafer (e.g., silicon wafer) such that several integrated devices are formed at the same time, and the wafer is then singulated to form individual integrated devices comprising a magnetic layer. The above sequence may be fabricated in one facility or at several facilities. For example, when a wafer includes an active portion and an interconnection portion, a portion that includes the magnetic layer may be fabricated over the interconnection portion. The wafer comprising the active portion, the interconnection portion and the magnetic layer may be singulated to form several integrated devices.

Figure 11:
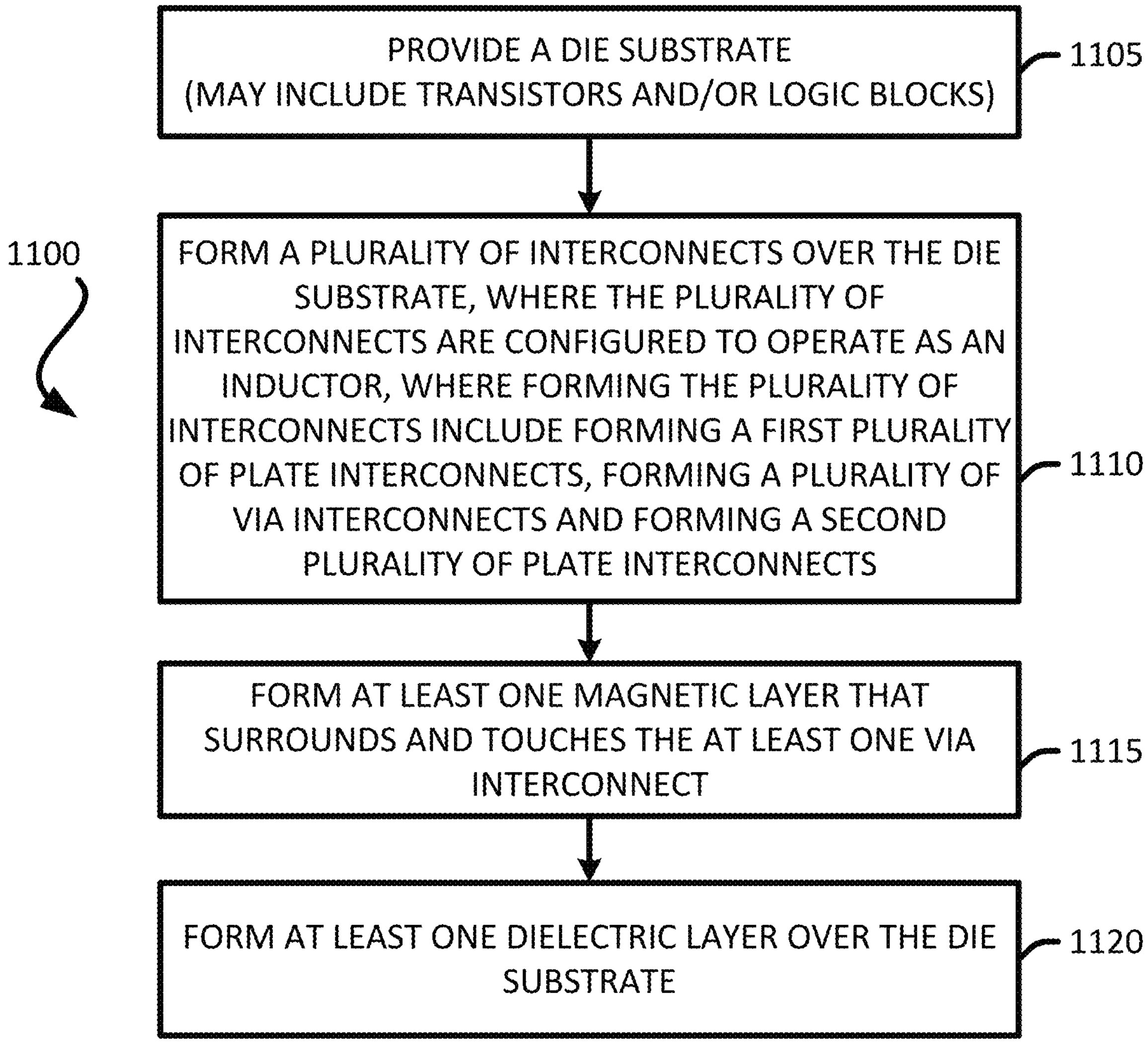
FIG. 11 illustrates an exemplary flow diagram of a method for fabricating an integrated device that includes plate interconnects and a magnetic material.

Exemplary Flow Diagram of a Method for Fabricating an Integrated Device Comprising a Plate Interconnect and Magnetic Layer In some implementations, fabricating an integrated device includes several processes. FIG. 11 illustrates an exemplary flow diagram of a method 1100 for providing or fabricating an integrated device that includes a plate interconnect and at least one magnetic layer. In some implementations, the method 1100 of FIG. 11 may be used to provide or fabricate the integrated device 105, the integrated device 801, and/or the integrated device 901. The method 1100 may be implemented on a wafer (e.g., silicon wafer) and then singulated into several integrated devices.

It should be noted that the method 1100 of FIG. 11 may combine one or more processes in order to simplify and/or clarify the method for providing or fabricating an integrated device. In some implementations, the order of the processes may be changed or modified.

The method provides (at 1105) a die substrate (e.g., 800). The die substrate 800 may include silicon (Si). The die substrate 800 may include a wafer (e.g., silicon wafer). A dielectric layer may be formed and/or located over the die substrate 800. A plurality of transistors may be formed in and/or over the die substrate 800. A plurality of logic blocks may be formed and/or defined by the plurality of transistors. When fabricating an integrated passive device, the die substrate 800 may be free of the plurality of transistors (e.g., free of active devices). Stage 1 of FIG. 10A, illustrates and describes an example of providing a die substrate.

The method forms (at 1110) a plurality of interconnects (e.g., 802) over the die substrate, where at least some of the interconnects from the plurality of interconnects (e.g., 802) are configured to operate as an inductor. A plating process and a patterning process may be used to form the at least one interconnect 802. The plurality of interconnects 802 may include the plurality of interconnects 832. The plurality of interconnects may be formed in and/or over at least one dielectric layer. The plurality of interconnects 802 may include a first plurality of plate interconnects 210, a plurality of via interconnects 220, and a second plurality of plate interconnects 230, as described in FIGS. 2-5. Thus, forming the plurality of interconnects may include forming a first plurality of plate interconnects, forming a plurality of via interconnects, and forming a second plurality of plate interconnects. In some implementations, one or more plate interconnects may include one or more slots. The plurality of via interconnects 220 are coupled to the first plurality of plate interconnects 210 and the second plurality of plate interconnects 230.

The method forms (at 1115) at least one magnetic layer (e.g., 840). A printing process that provide a magnetic layer as paste may be used to provide and form the at least one magnetic layer 840. The at least one magnetic layer 840 may laterally surround the plurality of interconnects 832. The at least one magnetic layer 840 may laterally surround the plurality of via interconnects 220. The at least one magnetic layer 840 may be located between the first plurality of plate interconnects 210 and the second plurality of plate interconnects 230. The at least one magnetic layer 840 may be formed in between when the plurality of interconnects are formed and when the at least one dielectric layer are formed. For example, the magnetic layer 840 may be formed after at least one dielectric layer is formed and a plurality of interconnects are formed. In some implementations, once the magnetic layer 840 is formed, additional dielectric layers and an additional plurality of interconnects may be formed. Stages 5 and 6 of FIG. 10C, illustrate and describe an example of forming a magnetic layer.

The method forms and patterns (at 1120) at least one dielectric layer (e.g., 820, 850, 860) over the die substrate (e.g., 800). A deposition, a lamination, an exposure, a development and/or an etching process may be used to form and pattern the at least one die dielectric layer (e.g., 820, 850, 860). It is noted that forming the plurality of interconnects and the at least one dielectric layer may be performed iteratively. That is, a dielectric layer may be formed followed by forming a plurality of interconnects, then forming another dielectric layer and then forming another plurality of interconnects. Thus, the method forming (at 1110) the plurality of interconnects and forming (at 1120) at least one dielectric layer may be performed iteratively for as many layers as required. In some implementations, the dielectric layer is formed and then the plurality of interconnects are formed. Stages 2 of FIG. 10A through Stage 4 of FIG. 10B, and Stages 7 of FIG. 10D through Stage 11 of FIG. 10E, illustrate and describe an example of forming a plurality of interconnects and forming at least one dielectric layer.

Figure 12:
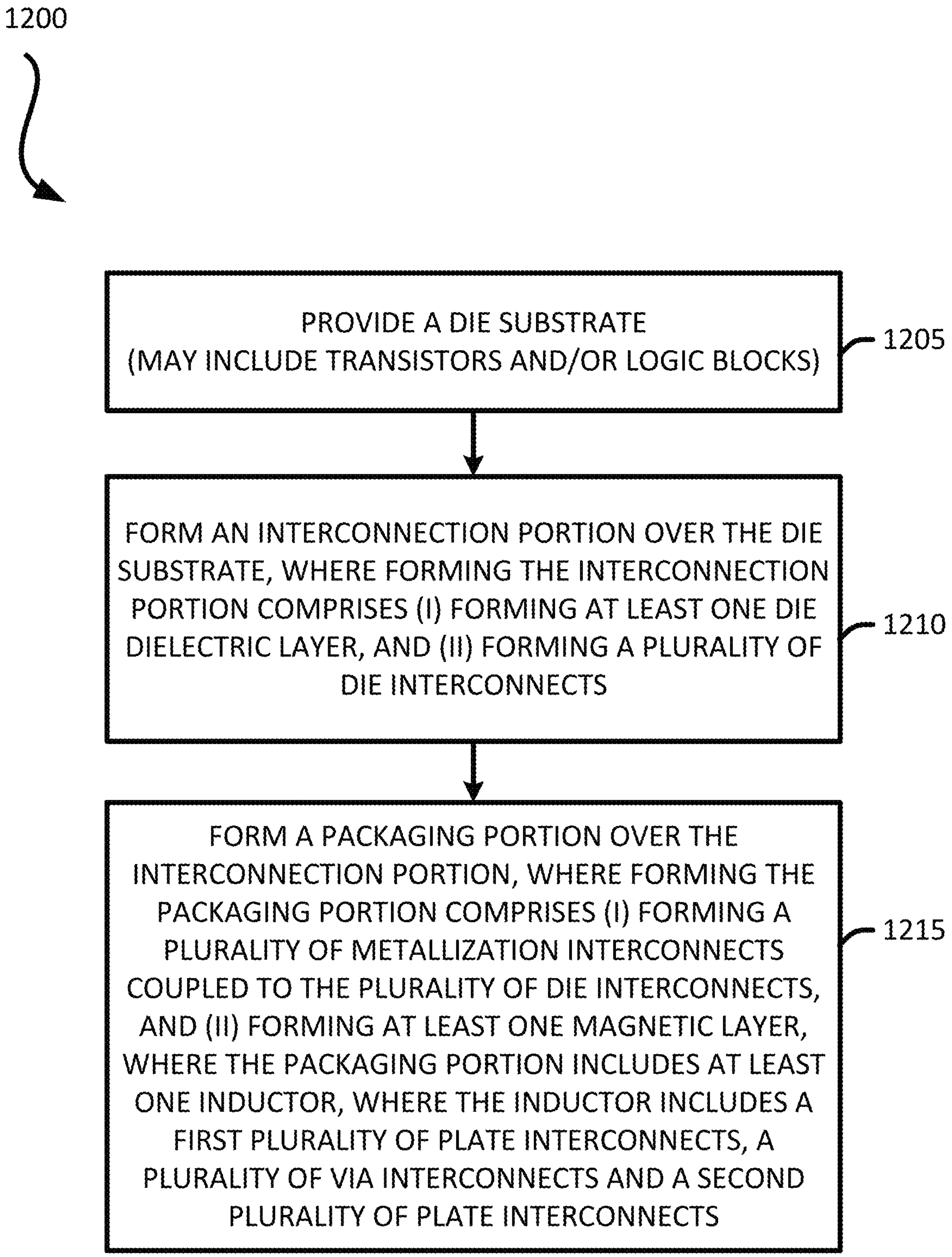
FIG. 12 illustrates an exemplary flow diagram of a method for fabricating an integrated device that includes plate interconnects and a magnetic material.

Exemplary Flow Diagram of a Method for Fabricating an Integrated Device Comprising a Plate Interconnect and Magnetic Layer In some implementations, fabricating an integrated device includes several processes. FIG. 12 illustrates an exemplary flow diagram of a method 1200 for providing or fabricating an integrated device that includes a plate interconnect and at least one magnetic layer. In some implementations, the method 1200 of FIG. 12 may be used to provide or fabricate the integrated device 105. The method 1200 may be implemented on a wafer (e.g., silicon wafer) and then singulated into several integrated devices.

It should be noted that the method 1200 of FIG. 12 may combine one or more processes in order to simplify and/or clarify the method for providing or fabricating an integrated device. For example, one or more of the processes of the method 1200 may 1200 may include one or more of the processes of the method 1100. In some implementations, the order of the processes may be changed or modified.

The method provides (at 1205) a die substrate (e.g., 800). The die substrate 800 may include silicon (Si). The die substrate 800 may include a wafer (e.g., silicon wafer). A plurality of transistors may be formed in and/or over the die substrate 800. A plurality of logic blocks may be formed and/or defined by the plurality of transistors. The die substrate 800 may be part of and/or define an active portion of an integrated device. When fabricating an integrated passive device, the die substrate 800 may be free of the plurality of transistors (e.g., free of active devices).

The method forms (at 1210) a die interconnection portion over the die substrate (e.g., 800), where forming the die interconnection portion includes forming at least one die dielectric layer and forming a plurality of die interconnects. The die interconnection portion may be coupled to the die substrate 800. Forming the die interconnection portion may include forming at least one die dielectric layer and forming and patterning at least one die interconnect.

The method forms (at 1215) a packaging portion over the die interconnection portion (e.g., 603), where forming the packaging portion includes forming a plurality of interconnects coupled to the plurality of die interconnects, and forming at least one magnetic layer. The packaging portion may be coupled to the die interconnection portion.

Forming the packaging portion may include forming and patterning a plurality of interconnects (e.g., 802), forming a magnetic layer and forming at least one dielectric layer (e.g., 820, 850, 860). The packaging portion may include an inductor that is defined by at least one interconnect from the plurality of interconnects (e.g., 802). The plurality of interconnects 802 may include a first plurality of plate interconnects 210, a plurality of via interconnects 220 and a second plurality of plate interconnects 230. The at least one magnetic layer includes an insulating layer, a dielectric layer, and/or a non-electrical conducting material. The at least one magnetic layer has a permeability value (e.g., relative permeability value) that is greater than 1.

In some implementations, the magnetic layer may laterally surround and touch one or more interconnects, and at least one dielectric layer may laterally surround and touch the magnetic layer, in a similar manner as described for the integrated device 601. In some implementations, the at least one dielectric layer may laterally surround and touch one or more interconnects, and the magnetic layer may laterally surround and touch the at least one dielectric layer, in a similar manner as described for the integrated device 701.

The method 1200 may iteratively repeat the process of (i) forming and patterning interconnects and (ii) forming and grinding a dielectric layer and/or a magnetic layer, for as many layers are required.

As mentioned above, the method 1200 may be performed on a wafer (e.g., silicon wafer) such that several integrated devices are formed at the same time, and the wafer is then singulated to form individual integrated devices comprising a magnetic layer.

Exemplary Electronic Devices

Figure 13:
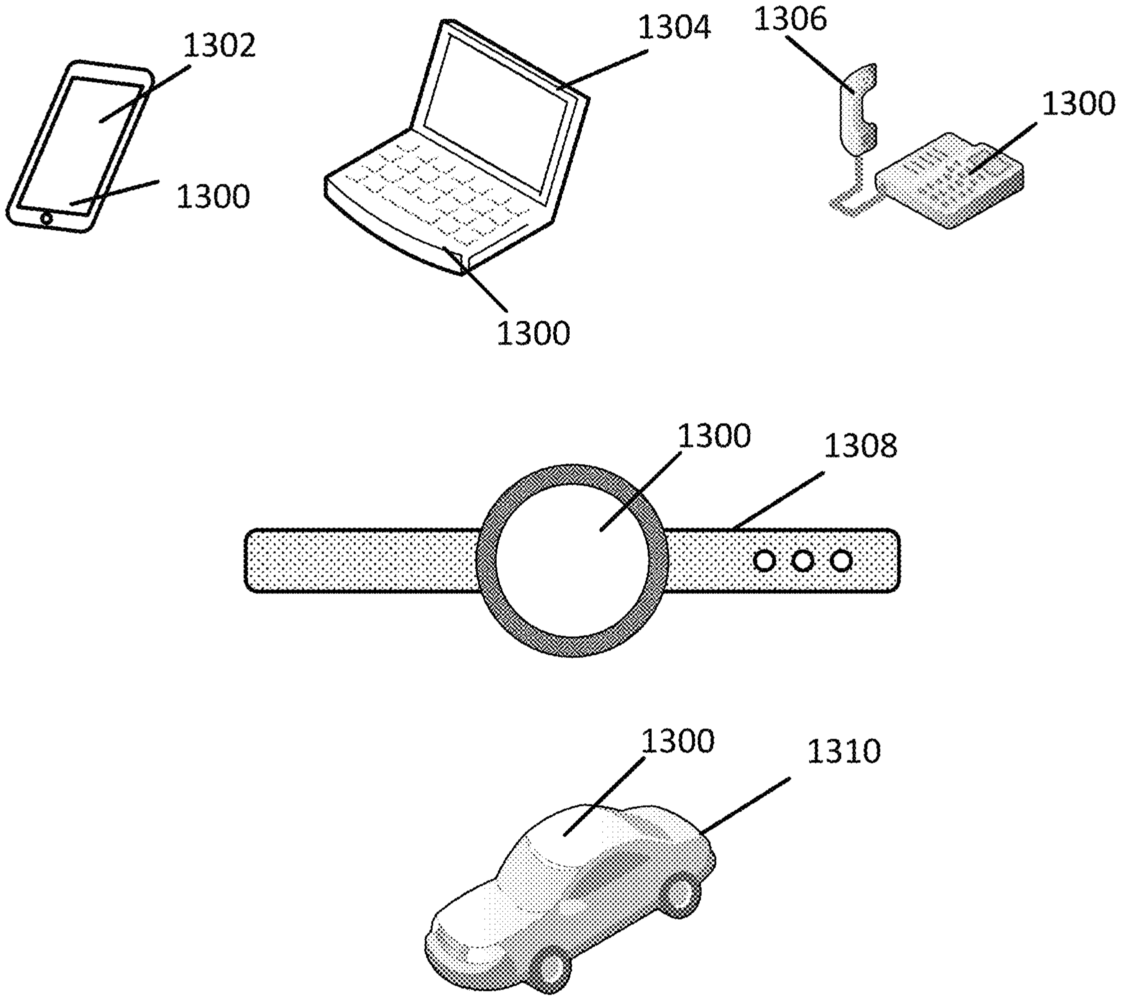
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10E, and/or 11-13 may be rearranged and/or combined into a single component, process, feature or function or embodied in several components, processes, or functions. Additional elements, components, processes, and/or functions may also be added without departing from the disclosure. It should also be noted FIGS. 1-9, 10A-10E, and/or 11-13 and its corresponding description in the present disclosure is not limited to dies and/or ICs. In some implementations, FIGS. 1-9, 10A-10E, and/or 11-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device comprising a die substrate, a plurality of interconnects, at least one magnetic layer, and at least one dielectric layer located over the die substrate. The plurality of interconnects are located over the die substrate. The plurality of interconnects comprise: a first plurality of plate interconnects; a second plurality of plate interconnects; and a plurality of via interconnects coupled to the first plurality of plate interconnects and the second plurality of plate interconnects. The first plurality of plate interconnects, the plurality of via interconnects, and the second plurality of plate interconnects are configured to operate as an inductor. The at least one magnetic layer surrounds at least part of the plurality of via interconnects.

Aspect 2: The device of aspect 1, wherein the plurality of interconnects comprises a first via interconnect and a second via interconnect, and wherein the at least one magnetic layer laterally surrounds and touches (i) the first via interconnect, and (ii) the second via interconnect.

Aspect 3: The device of aspects 1 through 2, wherein a plate interconnect from the first plurality of plate interconnects includes a first width, wherein a plate interconnect from the second plurality of plate interconnects includes a second width, wherein a via interconnect from the plurality of via interconnects includes a via width, and wherein the first width and the second width are each at least twice as wide as the via width.

Aspect 4: The device of aspect 3, wherein the first plurality of plate interconnects are aligned in a first direction, wherein the second plurality of plate interconnects are aligned in a second direction, and wherein an electrical path through the inductor includes a first plate interconnect from the first plurality of plate interconnects, a first plurality of via interconnects from the plurality of via interconnects, a first plate interconnect from the second plurality of plate interconnects, a second plurality of via interconnects from the plurality of via interconnects, a second plate interconnect from the first plurality of plate interconnects, a third plurality of via interconnects from the plurality of via interconnects, and a second plate interconnect from the second plurality of plate interconnects.

Aspect 5: The device of aspect 4, wherein the first plate interconnect from the first plurality of plate interconnects includes a first slot, and wherein the second plate interconnect from the second plurality of plate interconnects includes a second slot.

Aspect 6: The device of aspects 1 through 5, further comprising a plurality of transistors located in the die substrate.

Aspect 7: The device of aspects 1 through 6, wherein the at least one magnetic layer includes an insulating layer and/or a dielectric layer.

Aspect 8: The device of aspects 1 through 7, wherein the at least one magnetic layer includes a non-electrical conducting material.

Aspect 9: The device of aspects 1 through 8, wherein the at least one magnetic layer has a relative permeability value that is greater than 1.

Aspect 10: The device of aspects 1 through 10, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A device comprising a first integrated device, a second integrated device and a third integrated device. The first integrated device comprises a die substrate, a plurality of interconnects located over the die substrate. The plurality of interconnects comprise: a first plurality of plate interconnects; a second plurality of plate interconnects; and a plurality of via interconnects coupled to the first plurality of plate interconnects and the second plurality of plate interconnects. The first plurality of plate interconnects, the plurality of via interconnects and the second plurality of plate interconnects are configured to operate as an inductor. The first integrated device includes at least one magnetic layer that surrounds at least part of the plurality of via interconnects, and at least one dielectric layer located over the die substrate. The second integrated device is configured as a power management integrated device, wherein the second integrated device is configured to be electrically coupled to the first integrated device through a first electrical path. The third integrated device is configured to be electrically coupled to the first integrated device through a second electrical path.

Aspect 12: The device of aspect 11, wherein the plurality of interconnects comprises a first via interconnect and a second via interconnect, and wherein the at least one magnetic layer laterally surrounds and touches (i) the first via interconnect, and (ii) the second via interconnect.

Aspect 13: The device of aspects 11 through 12, wherein a plate interconnect from the first plurality of plate interconnects includes a first width, wherein a plate interconnect from the second plurality of plate interconnects includes a second width, wherein a via interconnect from the plurality of via interconnects includes a via width, and wherein the first width and the second width are each at least twice as wide as the via width.

Aspect 14: The device of aspect 13, wherein the first plurality of plate interconnects are aligned in a first direction, wherein the second plurality of plate interconnects are aligned in a second direction, and wherein an electrical path through the inductor includes a first plate interconnect from the first plurality of plate interconnects, a first plurality of via interconnects from the plurality of via interconnects, a first plate interconnect from the second plurality of plate interconnects, a second plurality of via interconnects from the plurality of via interconnects, a second plate interconnect from the first plurality of plate interconnects, a third plurality of via interconnects from the plurality of via interconnects, and a second plate interconnect from the second plurality of plate interconnects.

Aspect 15: The device of aspect 14, wherein the first plate interconnect from the first plurality of plate interconnects includes a first slot, and wherein the second plate interconnect from the second plurality of plate interconnects includes a second slot.

Aspect 16: The device of aspects 11 through 15, further comprising a plurality of transistors located in the die substrate.

Aspect 17: The device of aspects 11 through 16, wherein the at least one magnetic layer includes an insulating layer, a dielectric layer and/or a non-electrical conducting material, and wherein the at least one magnetic layer has a relative permeability value that is greater than 1.

Aspect 18: The device of aspects 11 through 17, wherein the first electrical path is configured as an electrical path for power having a first voltage, and wherein the second electrical path is configured as an electrical path for power having a second voltage that is different than the first voltage.

Aspect 19: The device of aspects 11 through 18, wherein the first integrated device and the second integrated device are part of a power distribution network (PDN).

Aspect 20: The device of aspect 11 through 19, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method provides a die substrate. The method forms a plurality of interconnects over the die substrate, wherein forming the plurality of interconnects comprises: forming a first plurality of plate interconnects; forming a plurality of via interconnects that coupled are coupled to the first plurality of plate interconnects; and forming a second plurality of plate interconnects that are coupled to the plurality of via interconnects. The first plurality of plate interconnects, the plurality of via interconnects and the second plurality of plate interconnects are configured to operate as an inductor. The method forms at least one magnetic layer that surrounds at least part of the plurality of via interconnects. The method forms at least one dielectric layer over the die substrate.

Aspect 22: The method of aspect 21, wherein the at least one magnetic layer is formed after the plurality of via interconnects are formed, and wherein forming the at least one dielectric layer comprises: forming a first dielectric layer before forming the plurality of via interconnects; and forming a second dielectric layer after forming the at least one magnetic layer.

Aspect 23: The method of aspects 21 through 22, wherein a plate interconnect from the first plurality of plate interconnects includes a first width, wherein a plate interconnect from the second plurality of plate interconnects includes a second width, wherein a via interconnect from the plurality of via interconnects includes a via width, and wherein the first width and the second width are each at least twice as wide as the via width.

Aspect 24: The method of aspect 23, wherein the first plurality of plate interconnects are aligned in a first direction, wherein the second plurality of plate interconnects are aligned in a second direction, and wherein an electrical path through the inductor includes a first plate interconnect from the first plurality of plate interconnects, a first plurality of via interconnects from the plurality of via interconnects, a first plate interconnect from the second plurality of plate interconnects, a second plurality of via interconnects from the plurality of via interconnects, a second plate interconnect from the first plurality of plate interconnects, a third plurality of via interconnects from the plurality of via interconnects, and a second plate interconnect from the second plurality of plate interconnects.

Aspect 25: The method of aspect 24, wherein the first plate interconnect from the first plurality of plate interconnects includes a first slot, and wherein the second plate interconnect from the second plurality of plate interconnects includes a second slot.

Aspect 26: The method of aspects 21 through 25, further comprising a plurality of transistors located in the die substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
- a die substrate;
- a plurality of interconnects located over the die substrate, wherein the plurality of interconnects comprise:
  - a first plurality of plate interconnects comprising:
    - a first plate interconnect; and
    - a second plate interconnect;
  - a second plurality of plate interconnects comprising:
    - a third plate interconnect; and
    - a fourth plate interconnect,
    - wherein the third plate interconnect and the fourth plate interconnect are located on a different metal layer than the first plate interconnect and the second plate interconnect,
    - wherein the first plate interconnect vertically overlaps with the third plate interconnect,
    - wherein the second plate interconnect vertically overlaps with the third plate interconnect, and
    - wherein the second plate interconnect vertically overlaps with the fourth plate interconnect; and
  - a plurality of via interconnects coupled to the first plurality of plate interconnects and the second plurality of plate interconnects, wherein the plurality of via interconnects comprises:
    - a first via interconnect coupled to the first plate interconnect and the third plate interconnect;
    - a second via interconnect coupled to the first plate interconnect and the third plate interconnect, wherein the first via interconnect and the second via interconnect vertically overlap with the first plate interconnect and the third plate interconnect;
    - a third via interconnect coupled to the third plate interconnect and the second plate interconnect;

a fourth via interconnect coupled to the second plate interconnect and the fourth plate interconnect, and wherein the first plurality of plate interconnects, the plurality of via interconnects, and the second plurality of plate interconnects are configured to operate as an inductor;

at least one magnetic layer that surrounds at least part of the plurality of via interconnects, wherein the at least one magnetic layer laterally surrounds the first via interconnect and the second via interconnect; and at least one dielectric layer located over the die substrate.

2. The device of claim 1, wherein the at least one magnetic layer laterally surrounds and touches (i) the first via interconnect, and (ii) the second via interconnect.

3. The device of claim 1, wherein a plate interconnect from the first plurality of plate interconnects includes a first width, wherein a plate interconnect from the second plurality of plate interconnects includes a second width, wherein a via interconnect from the plurality of via interconnects includes a via width, and wherein the first width and the second width are each at least twice as wide as the via width.

4. The device of claim 3, wherein the first plurality of plate interconnects are aligned in a first direction, wherein the second plurality of plate interconnects are aligned in a second direction, and wherein an electrical path through the inductor includes the first plate interconnect from the first plurality of plate interconnects, the first via interconnect, the second via interconnect, the third plate interconnect from the second plurality of plate interconnects, the third via interconnect from the plurality of via interconnects, the second plate interconnect from the first plurality of plate interconnects, the fourth via interconnect from the plurality of via interconnects, and a second the fourth plate interconnect from the second plurality of plate interconnects.

5. The device of claim 4, wherein the first plate interconnect from the first plurality of plate interconnects includes a first slot, and wherein the second third plate interconnect from the second plurality of plate interconnects includes a second slot.

6. The device of claim 1, further comprising a plurality of transistors located in the die substrate.

7. The device of claim 1, wherein the at least one magnetic layer includes an insulating layer and/or a dielectric layer.

8. The device of claim 1, wherein the at least one magnetic layer includes a non-electrical conducting material.

9. The device of claim 1, wherein the at least one magnetic layer has a relative permeability value that is greater than 1.

10. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IOT) device, and a device in an automotive vehicle.

11. A device comprising:

(i) a first integrated device comprising:

a die substrate;

a plurality of interconnects located over the die substrate, wherein the plurality of interconnects comprise:

a first plurality of plate interconnects;

a second plurality of plate interconnects; and a plurality of via interconnects coupled to the first plurality of plate interconnects and the second plurality of plate interconnects, wherein the plurality of via interconnects comprise:

a first via interconnect;

a second via interconnect coupled to and touching the first via interconnect, and wherein the first plurality of plate interconnects, the plurality of via interconnects and the second plurality of plate interconnects are configured to operate as an inductor;

at least one magnetic layer that surrounds at least part of the plurality of via interconnects, wherein the at least one magnetic layer laterally surrounds the first via interconnect; and at least one dielectric layer located over the die substrate;

(ii) a second integrated device configured as a power management integrated device, wherein the second integrated device is configured to be electrically coupled to the first integrated device through a first electrical path; and (iii) a third integrated device configured to be electrically coupled to the first integrated device through a second electrical path.

12. The device of claim 11, wherein the plurality of via interconnects comprises a third via interconnect and a fourth via interconnect coupled to and touching the third via interconnect, and wherein the at least one magnetic layer laterally surrounds and touches the third via interconnect.

13. The device of claim 11, wherein a plate interconnect from the first plurality of plate interconnects includes a first width, wherein a plate interconnect from the second plurality of plate interconnects includes a second width, wherein a via interconnect from the plurality of via interconnects includes a via width, and wherein the first width and the second width are each at least twice as wide as the via width.

14. The device of claim 13, wherein the first plurality of plate interconnects are aligned in a first direction, wherein the second plurality of plate interconnects are aligned in a second direction, and wherein an electrical path through the inductor includes a first plate interconnect from the first plurality of plate interconnects, the first via interconnect and the second via interconnect from the plurality of via interconnects, a first plate interconnect from the second plurality of plate interconnects, a first plurality of via interconnects from the plurality of via interconnects, a second plate interconnect from the first plurality of plate interconnects, a second plurality of via interconnects from the plurality of via interconnects, and a second plate interconnect from the second plurality of plate interconnects.

15. The device of claim 14, wherein the first plate interconnect from the first plurality of plate interconnects includes a first slot, and wherein the second plate interconnect from the second plurality of plate interconnects includes a second slot.

16. The device of claim 11, further comprising a plurality of transistors located in the die substrate.

17. The device of claim 11, wherein the at least one magnetic layer includes an insulating layer, a dielectric layer and/or a non-electrical conducting material, and wherein the at least one magnetic layer has a relative permeability value that is greater than 1.

18. The device of claim 11, wherein the first electrical path is configured as an electrical path for power having a first voltage, and wherein the second electrical path is configured as an electrical path for power having a second voltage that is different than the first voltage.

19. The device of claim 11, wherein the first integrated device and the second integrated device are part of a power distribution network (PDN).

20. The device of claim 11, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *